United States Patent
Makinouchi et al.

(10) Patent No.: US 8,390,780 B2
(45) Date of Patent: Mar. 5, 2013

(54) MOVABLE-BODY APPARATUS, EXPOSURE APPARATUS, EXPOSURE METHOD, AND DEVICE MANUFACTURING METHOD

(75) Inventors: Susumu Makinouchi, Zama (JP); Toru Imai, Natori (JP); Akihiro Watanabe, Sendai (JP)

(73) Assignee: Nikon Corporation, Tokyo (JP)

( * ) Notice: Subject to any disclaimer, the term of this patent is extended or adjusted under 35 U.S.C. 154(b) by 927 days.

(21) Appl. No.: 12/330,119

(22) Filed: Dec. 8, 2008

(65) Prior Publication Data

US 2009/0135388 A1      May 28, 2009

Related U.S. Application Data

(63) Continuation of application No. PCT/JP2007/061714, filed on Jun. 11, 2007.

(30) Foreign Application Priority Data

Jun. 9, 2006 (JP) ................................. 2006-160910

(51) Int. Cl.
*G03B 27/42* (2006.01)
(52) U.S. Cl. .............................. 355/53; 355/72; 356/499
(58) Field of Classification Search .................... 355/53, 355/72; 356/499
See application file for complete search history.

(56) References Cited

U.S. PATENT DOCUMENTS

| | | | |
|---|---|---|---|
| 4,780,617 A | 10/1988 | Umatate et al. | |
| 5,493,403 A | 2/1996 | Nishi | |
| 5,579,111 A | 11/1996 | Maeda | |
| 5,610,715 A * | 3/1997 | Yoshii et al. | 356/499 |
| 5,909,283 A * | 6/1999 | Eselun | 356/499 |
| 6,285,444 B1 * | 9/2001 | Osanai et al. | 355/72 |
| 6,590,634 B1 | 7/2003 | Nishi et al. | |
| 6,611,316 B2 | 8/2003 | Sewell | |
| 6,778,257 B2 | 8/2004 | Bleeker et al. | |
| 7,023,610 B2 | 4/2006 | Ohtsuki et al. | |
| 2005/0128461 A1 | 6/2005 | Beems et al. | |
| 2006/0077396 A1 | 4/2006 | Park | |

FOREIGN PATENT DOCUMENTS

| | | |
|---|---|---|
| EP | 1 630 585 A1 | 3/2006 |
| JP | A-61-44429 | 3/1986 |
| JP | 63-231217 | 9/1988 |
| JP | A-63-231217 | 9/1988 |
| JP | 04-065603 | 3/1992 |
| JP | A-5-40184 | 2/1993 |

(Continued)

OTHER PUBLICATIONS

Written Opinion issued in JP Application No. 2007/061714 on Sep. 4, 2007 (with English translation).

(Continued)

*Primary Examiner* — Hung Henry Nguyen
*Assistant Examiner* — Mesfin T Asfaw
(74) *Attorney, Agent, or Firm* — Oliff & Berridge, PLC

(57) ABSTRACT

A moving grating is arranged on a side of a wafer stage, a light source irradiates a light to the moving grating, diffracted lights generated from the moving grating are interfered by fixed scales and an index scale of which positional relation with the light source is fixed, and a detection instrument detects the interfered light. In this case, since the moving grating is arranged on a side of the wafer stage, upsizing of the entire wafer stage can be suppressed. Further, since interference occurs between a plurality of diffracted lights (e.g., the ±1st-order diffracted light) passing extremely close optical paths, influence caused by a fluctuation of ambient atmosphere becomes less in comparison to conventional interferometers, and thus, a high-precision measurement of positional information of the movable body is possible.

69 Claims, 10 Drawing Sheets

FOREIGN PATENT DOCUMENTS

| | | |
|---|---|---|
| JP | A-07-004993 | 1/1995 |
| JP | A-7-4993 | 1/1995 |
| JP | 10-038517 | 2/1998 |
| JP | A-10-38517 | 2/1998 |
| JP | A-10-163099 | 6/1998 |
| JP | A-10-214783 | 8/1998 |
| JP | A-2004-101362 | 4/2004 |
| JP | A-2004-519850 | 7/2004 |
| JP | A-2005-229091 | 8/2005 |
| JP | A-2006-106000 | 4/2006 |
| WO | WO 98/40791 | 9/1998 |
| WO | WO 99/46835 | 9/1999 |
| WO | WO 01/35168 A1 | 5/2001 |
| WO | WO 2004/053955 A1 | 6/2004 |
| WO | WO 2004/107011 A1 | 12/2004 |
| WO | WO 2005/074014 A1 | 8/2005 |
| WO | WO 2006/038952 A2 | 4/2006 |
| WO | WO 2007/034379 A2 | 3/2007 |

OTHER PUBLICATIONS

Office Action issued in CN Application No. 200780021002.7 on May 4, 2010 (with English translation).
Office Communication issued in corresponding Chinese Application No. 200780021002.7 dated Dec. 29, 2010.
May 22, 2012 Office Action issued in Japanese Patent Application No. 2008-520646 (with translation).
Aug. 8, 2012 Office Action issued in Japanese Patent Application No. 2008-520646 (with translation).

* cited by examiner

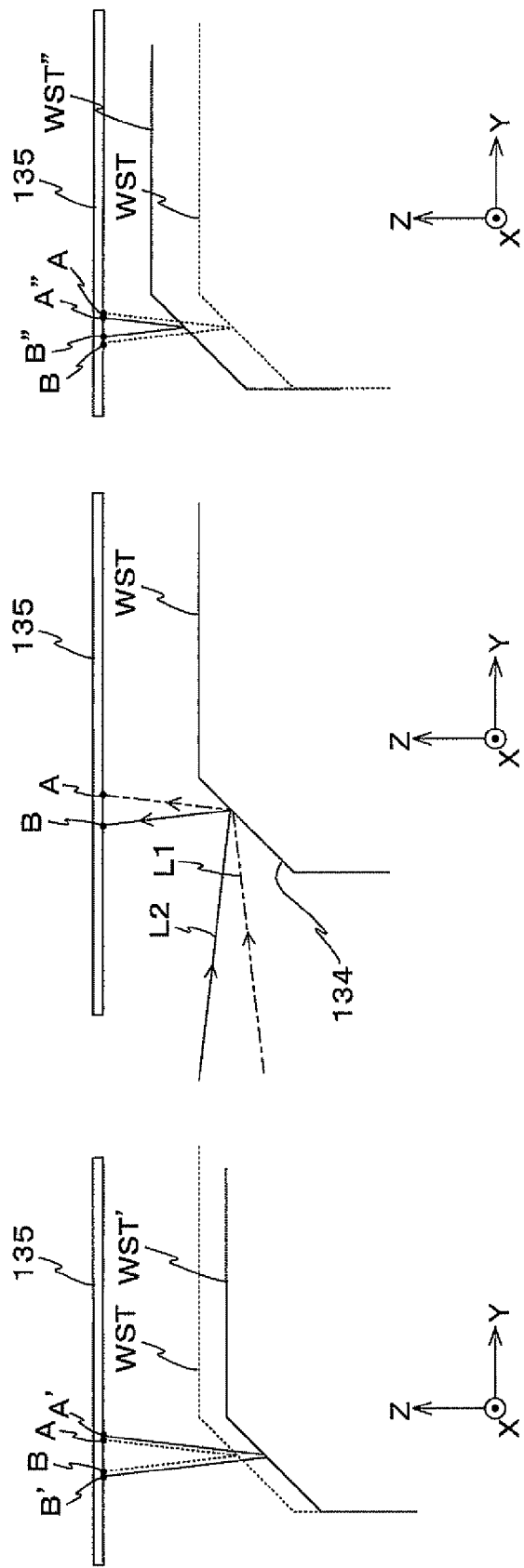

MOVABLE-BODY APPARATUS, EXPOSURE APPARATUS, EXPOSURE METHOD, AND DEVICE MANUFACTURING METHOD

CROSS-REFERENCE TO RELATED APPLICATIONS

This application is a continuation of International Application PCT/JP2007/061714, with an international filing date of Jun. 11, 2007, the disclosure of which is hereby incorporated herein by reference in its entirety, which was not published in English.

BACKGROUND OF THE INVENTION

1. Field of the Invention

The present invention relates to a movable-body apparatus, an exposure apparatus, an exposure method, and a device manufacturing method, more particularly to a movable-body apparatus equipped with a movable body that moves at least in an axis direction within a moving plane, an exposure apparatus is equipped with the movable-body apparatus, an exposure method in which a pattern is formed on an object by exposing it, and a device manufacturing method with the exposure method.

2. Description of the Background Art

Conventionally, in a lithography process, on manufacturing micro devices (electronic devices) such as a semiconductor device, a liquid-crystal display element, etc., a reduction-projection exposure apparatus of a step-and-repeat type (a so-called stepper), a scanning-projection exposure apparatus of a step-and-scan type (a so-called scanning stepper (also called a scanner), etc. is relatively mainly used.

In this type of exposure apparatuses, to transfer a pattern of a reticle (or a mask) onto a plurality of shot areas on a substrate such as a wafer and a glass plate (hereinafter, generally referred to as a "wafer"), a wafer stage that holds the wafer is driven in an XY two-dimensional direction, e.g., by a linear motor etc. Particularly for scanning steppers, not only the wafer stage, but also a reticle stage that holds the reticle is driven by a linear motor etc. in a scan direction within a predetermined stroke. Position measurements of the reticle stage and the wafer stage are generally performed by using a laser interferometer with a good stability of measurements for a long period and a high resolution.

However, due to finer patterns which come from higher integration of semiconductor devices, a positional controllability of stages with a higher precision is required, and now, a short-term fluctuation of measured values caused by a fluctuation of atmospheric temperature on optical paths of beams of laser interferometers has become non-negligible.

On the other hand, recently, an encoder, which is a type of position-measurement devices, with a measurement resolution equivalent to or higher than that of laser interferometers has appeared, and techniques to use the encoder (including a linear scale and a length-measurement device) for position measurement of the wafer stage inside an exposure apparatus have been also proposed (refer, e.g., to Kokai (Japanese Unexamined Patent Application Publication) No. 2004-101362).

However, for encoders described in Kokai (Japanese Unexamined Patent Application Publication) No. 2004-101362, etc., since it was necessary to install a linear scale far from a wafer-mounting position on the wafer stage (a position onto which an exposure light is actually irradiated), there were fears of occurrence of Abbe errors in measurements and upsizing of the external shape of the entire wafer stage.

SUMMARY OF THE INVENTION

The present invention has been created under the circumstances described above, and according to a first aspect, there is provided a first movable-body apparatus comprising: a movable body that moves at least in an axis direction within a moving plane; and a measuring device having: a light source that irradiates a light onto a moving grating on a predetermined plane of the movable body, the predetermined plane crossing the moving plane; an optical system of which a positional relation with the light source is fixed and which allows a plurality of diffracted lights generated from the moving grating to interfere with each other; and a detection instrument that detects the interfered lights.

In this apparatus, the moving grating is arranged on a predetermined plane, which crosses the moving plane, of the movable body, a light is irradiated from the light source of the measuring device onto the moving grating, the optical system of which a positional relation with the light source is fixed and which allows a plurality of diffracted lights generated from the moving grating to interfere with each other, and the detection instrument detects the interfered lights. In this case, because the moving grating is arranged on a predetermined plane which is a part of the movable body, upsizing of the entire movable body can be suppressed. Further, since interference occurs between a plurality of diffracted lights (e.g., the ±1st-order diffracted lights) which pass through extremely close optical paths, influence caused by a fluctuation of ambient atmosphere becomes less in comparison to conventional interferometers, and thus, a high-precision measurement of positional information of the movable body is made possible. Further, similarly to interferometers, the optical axis of lights irradiated from the light source of the measuring device can be set to pass on a standard point which is a standard of the measurement, and thus, a measurement without Abbe errors is made possible. Note that of course the apparatus is not limited to a measurement without Abbe errors.

According to a second aspect of the present invention, there is provided a second movable-body apparatus, comprising: a movable body that moves at least in an axis direction within a moving plane and has a reflection plane which crosses the moving plane on a part thereof; and a measuring device having: a light source that irradiates a light onto the reflection plane; fixed scales of which positional relation with the light source is fixed, which have a one-dimensional grating with a periodic direction in the axis directions and on which a light reflected on the reflection plane enters; an optical system that allows a plurality of diffracted lights generated from the one-dimensional grating to interfere with each other; and a detection instrument that detects the interfered lights.

In this apparatus, a light is irradiated from the light source of the measuring device onto the reflection plane of the movable body, a light reflected on the reflection plane enters a one-dimensional grating of the fixed scales with a fixed positional relation with the light source. Then, a plurality of diffracted lights generated from the one-dimensional grating are allowed to interfere with each other by the optical system, and the detection instrument detects the interfered lights. As described above, since a position measurement of the movable body with a one-dimensional grating can be performed via a reflection plane arranged on the movable body, it is unnecessary to arrange a one-dimensional grating on the movable body, and upsizing of the movable body can be suppressed. Further, since a plurality of diffracted lights generated from the fixed scales can be led to an optical system by approaching with each other, influence caused by a fluctuation of ambient atmosphere becomes less in comparison to conventional interferometers, and a high-precision measurement of positional information of the movable body is made possible. Further, similarly to the interferometer, the optical axis of lights irradiated from the light source of the measuring device can be set to pass on a standard point which is a standard of the measurement.

According to a third aspect of the present invention, there is provided a third movable-body apparatus, comprising: a movable body that moves at least in an axis direction within a moving plane; and a measuring device that measures position of the movable body, by irradiating a light onto a moving grating arranged along a plane of the movable body, the plane crossing the moving plane, and by detecting a light passed through the moving grating.

In this apparatus, since the moving grating arranged on the movable body is arranged along a plane crossing the moving plane, influence caused by a fluctuation of ambient atmosphere becomes less in comparison to conventional interferometers. Hence, a high-precision measurement of positional information of the movable body is made possible. Further, upsizing of the entire movable body can be suppressed.

According to a fourth aspect of the present invention, there is provided a fourth movable-body apparatus, comprising: a movable body that moves in a direction parallel to at least a single axis within a moving plane; and a measuring device having: a light source that irradiates a light onto a moving grating on a predetermined plane of the movable body, the predetermined plane crossing the moving plane; a fixed optical element of which positional relation with the light source is fixed, which diffracts or reflects a light diffracted at the moving grating, and return the light to the moving grating; and a detection instrument that detects a light interfered after passing through the moving grating again.

In this apparatus, a light is irradiated from the light source of the measuring device onto the moving grating on a predetermined plane, which crosses the moving plane, of the movable body, and a light diffracted at the moving grating enters the fixed optical element. The light that enters the fixed optical element is diffracted or reflected by the fixed optical element and returns to the moving grating, a light interfered at the moving grating are detected by the detection instrument. In this case, since the moving grating is arranged on a predetermined plane being a part of the movable body, upsizing of the entire movable body can be suppressed. Further, since interference occurs between the fixed optical element and the moving grating, influence caused by a fluctuation of ambient atmosphere becomes less in comparison to conventional interferometers, and thus, a high-precision measurement of positional information of the movable body is made possible. Similarly to interferometers, the optical axis of lights irradiated from the light source of the measuring device can be set to pass on a standard point which is a standard of the measurement.

According to a fifth aspect of the present invention, there is provided a fifth movable-body apparatus, comprising: a movable body that moves in a first and a second directions orthogonal to each other within a predetermined plane and has a reflection plane which crosses the plane at an acute angle and on which a diffraction grating is formed; a measuring device that includes a fixed optical element, which is arranged by extending in the first direction substantially parallel to the plane and a part of which faces the reflection plane, irradiates a light beam onto the reflection plane along the first direction, and detects diffracted beam which are generated from the reflection plane and reflected on the fixed optical element and the reflection plane, after allowing the beams to interfere with each other, and measures positional information of the movable body.

In this apparatus, the measuring device includes the fixed scale, which is arranged by extending in the first direction substantially parallel to a predetermined plane and has a diffraction grating, irradiates a light beam onto the fixed scale via the reflection plane of the movable body and detects a plurality of diffracted beams generated from the fixed scale after allowing the beams to interfere with each other, and measures positional information of the movable body. It is thereby unnecessary to arrange a grating on the movable body, and upsizing of the movable body can be suppressed. Further, influence caused by a fluctuation of ambient atmosphere becomes less in comparison to conventional interferometers, and a high-precision measurement of positional information of the movable body is made possible.

According to a sixth aspect of the present invention, there is provided a sixth movable-body apparatus, comprising: a movable body that moves in a first and a second directions orthogonal to each other within a predetermined plane; and a measuring device that includes a fixed scale which is arranged by extending in the first direction substantially parallel to the plane and has a diffraction grating, irradiates a light beam onto the fixed scale via a reflection plane of the movable body and detects a plurality of diffracted beams generated from the fixed scale after allowing the beams to interfere with each other, and measures positional information of the movable body.

In this apparatus, the measuring device includes the fixed scale, which is arranged by extending in the first direction substantially parallel to a predetermined plane and has a diffraction grating, irradiates a light beam onto the fixed scale via the reflection plane of the movable body and detects a plurality of diffracted beams generated from the fixed scale after allowing the beams to interfere with each other, and measures positional information of the movable body. It is thereby unnecessary to arrange a grating on the movable body, and upsizing of the movable body can be suppressed. Further, influence caused by a fluctuation of ambient atmosphere becomes less in comparison to conventional interferometers, and a high-precision measurement of the positional information of the movable body is made possible.

According to a seventh aspect of the present invention, there is provided a seventh movable-body apparatus, comprising: a movable body that moves in a first and a second directions orthogonal to each other within a predetermined plane, and has a first reflection plane that is arranged by extending along the second direction and crosses the plane at an acute angle within a plane parallel to the first direction and orthogonal to the plane and a second reflection plane that is arranged by extending along the first direction and crosses the plane at an acute angle within a plane parallel to the second direction and orthogonal to the plane; and a measuring device that includes a first and a second reflecting members substantially parallel to the plane and arranged by extending, respectively, in the first and the second directions, irradiates a first light beam onto the first reflection plane and allows a plurality of first diffracted beams reflected on the first reflecting member and the first reflection plane to interfere with each other and detects the beams, irradiates a second light beam onto the second reflection plane and allows a plurality of second diffracted beams reflected on the second reflecting member and the second reflection plane to interfere with each other and detects the beams, and measures positional information of the movable body in the first and the second directions, wherein a diffraction grating is arranged on at least one of the first reflection plane and the first reflecting member and on at least one of the second reflection plane and the second reflecting member.

In this apparatus, the measuring device enables a high-precision measurement of positional information in the first and the second directions of the movable body with less influence caused by a fluctuation of ambient atmosphere in comparison to conventional interferometers. Further, since the diffraction grating is arranged on at least one of the first reflection plane and the first reflecting member and on at least one of the second reflection plane and the second reflecting member, upsizing of the entire movable body can be suppressed.

According to an eighth aspect of the present invention, there is provided a first exposure apparatus that exposes an object to form a pattern, the apparatus comprising: any one of the first to the seventh movable-body apparatuses of the present invention which includes a movable body that moves the object while holding the object.

In this apparatus, since the movable body included in each of the movable-body apparatuses described above moves while holding the object, the object can be moved at a high precision and a high acceleration on exposing the object to form a pattern, and thus, a high-precision exposure can be performed at a high throughput.

According to a ninth aspect of the present invention, there is provided a second exposure apparatus that transfers a pattern formed on a mask onto an object, the apparatus comprising: any one of the first to the seventh movable-body apparatuses of the present invention which includes a movable body that moves while holding at least one of the mask and the object.

In this apparatus, at least one of the mask and the object is held and driven by the movable body included in each of the movable-body apparatuses described above. For this reason, on transferring the pattern formed on the mask onto the object, at least one of the mask and the object can be moved at a high precision and a high acceleration, and thus, a high-precision exposure can be performed at a high throughput.

According to a tenth aspect of the present invention, there is provided a first exposure method in which an object is exposed and a pattern is formed on the object, the method comprising: irradiating a light onto a predetermined plane, which crosses a moving plane, of a movable body that moves along the moving plane while holding the object, and measuring a position of the movable body by using a light via the predetermined plane and a moving grating with a predetermined positional relation to the predetermined plane; and exposing the object while the movable body is moved, based on the measurement results.

In this method, since the position of the movable body is measured via a predetermined plane crossing the moving plane of the movable body that moves while holding the object and via the moving grating with a predetermined positional relation to the predetermined plane, influence by a fluctuation of ambient atmosphere is less in comparison to conventional interferometers. Further, it is unnecessary to arrange additional members used for the measurement on the movable body, and upsizing of the entire movable body is suppressed. Thus, the movable body can be moved at a high precision and a high acceleration, and a high-throughput and high-precision exposure can be realized.

According to an eleventh aspect of the present invention, there is provided a second exposure method in which an object is exposed with an exposure light, the method comprising: holding the object by a movable body that moves in a first and a second directions orthogonal to each other within a predetermined plane and has a reflection plane which crosses the plane at an acute angle and on which a diffraction grating is formed; measuring positional information of the movable body, by irradiating a light beam onto the reflection plane along the first direction and by detecting diffracted beams, which are generated from the reflection plane and reflected on a fixed optical element arranged by extending in the first direction substantially parallel to the plane and the reflection plane, after allowing the beams to interfere with each other; and moving the movable body based on the positional information.

In this method, a highly precise positioning and higher acceleration of the movable body is made possible, and a high-throughput and high-precision exposure can be realized.

According to a twelfth aspect of the present invention, there is provided is a third exposure method in which an object is exposed with an exposure light, the method comprising: holding the object by a movable body that moves in a first and a second directions orthogonal to each other within a predetermined plane; measuring positional information of the movable body, by irradiating a light beam onto a fixed scale, which is arranged by extending in the first direction substantially parallel to the plane and has a diffraction grating, via a reflection plane of the movable body, and by detecting a plurality of diffracted beams generated from the fixed scale; and moving the movable body based on the positional information.

In this method, a highly precise positioning and higher acceleration of the movable body is made possible, and a high-throughput and high-precision exposure can be realized.

Further, in a lithography process, an object is exposed by using any one of the first to the third exposure methods of the present invention, a pattern is formed on the object, treatments (e.g., development, etching, etc.) are applied to the object on which the pattern is formed, and thus productivity of highly-integrated micro devices can be improved. Therefore, it can be concluded that the present invention, according to further another aspect, is a device manufacturing method with any one of the first to the third exposure methods in the present invention.

BRIEF DESCRIPTION OF THE DRAWINGS

In the accompanying drawings;

FIGS. 7A to 7C are views for explaining the principle of position measurement with respect to the Z-axis direction for the wafer stage in the fourth embodiment;

DESCRIPTION OF THE EMBODIMENTS

First Embodiment

Hereinafter, we describe a first embodiment of the present invention with FIGS. 1 to 3.

Figure 1:
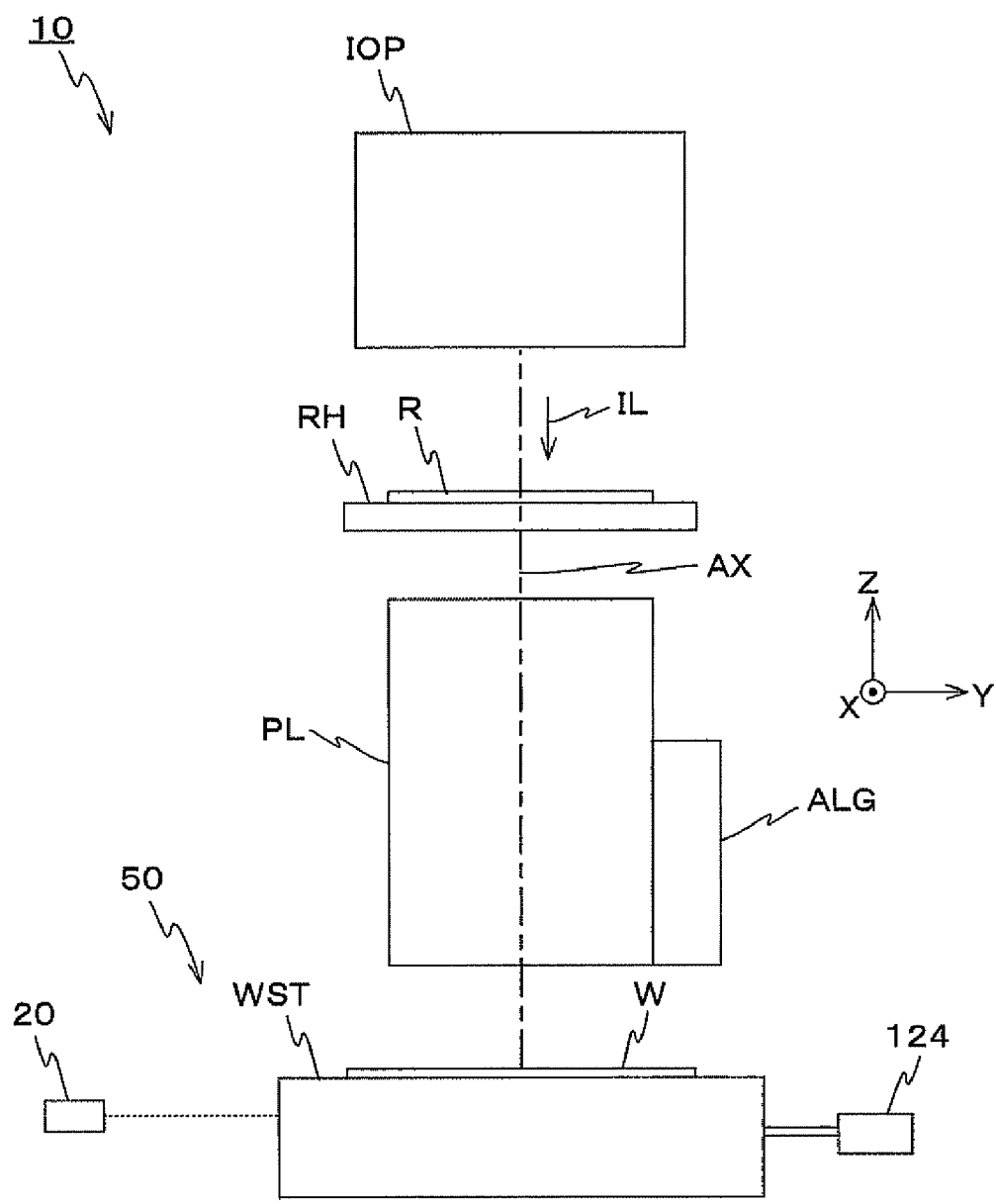
FIG. 1 is a view showing a schematic constitution of the exposure apparatus in the first embodiment.

FIG. 1 shows a schematic constitution of an exposure apparatus 10 in the first embodiment. The exposure apparatus 10 is a projection exposure apparatus of the one-shot exposure type such as a stepper etc. As described later, in the present embodiment, a projection optical system PL is arranged, and hereinafter, it is supposed that a direction parallel to the optical axis AX of the projection optical system PL is the Z-axis direction, the horizontal direction in FIG. 1 within a plane orthogonal to the Z-axis, a direction orthogonal to the Z-axis and the Y-axis (a orthogonal direction on the page surface of FIG. 1) is the Y-axis direction, and rotation (tilt) directions around the X-axis, the Y-axis, and the Z-axis are, respectively, the θx, θy, and θz directions.

The exposure apparatus 10 includes an illumination unit IOP, a reticle holder RH that holds a reticle R, a projection optical system PL, a stage unit 50 including a wafer stage WST that holds a wafer W and moves two-dimensionally along a predetermined plane (an XY plane including the X-axis and the Y-axis orthogonal to each other in the present embodiment), a control system of these devices, etc.

The illumination unit IOP includes a light source and an illumination optical system, irradiates an illumination light IL onto a rectangular (e.g. square) illumination area, which is set by a field stop (also called a masking blade or a reticle blind) placed inside the unit, and uniformly illuminates the reticle R on which a circuit pattern is formed. As the illumination light IL, it is supposed that, e.g., a bright line in an ultraviolet region (the g-line with a wavelength of 436 nm, the i-line with a wavelength of 365 nm, etc.) from an ultra high pressure mercury lamp is used. Here, vacuum ultraviolet lights such as a KrF excimer laser light (with a wavelength of 248 nm), an ArF excimer laser light (193 nm), and an $F_2$ laser light (157 nm) can be used instead.

The reticle holder RH is placed below the illumination unit IOP. The reticle holder RH is actually mounted on the upper surface of the projection optical system PL (in FIG. 1, for convenience of illustration, the reticle holder RH and the projection optical system PL are separately shown). Specifically, the reticle holder RH is designed to hold the reticle R on a base fixed on the upper surface of the projection optical system PL, and capable of fine drive in the X-axis direction, the Y-axis direction, and the θz direction by the controller (not shown). Note that the reticle holder RH can be also constituted to have a function of simply holding the reticle R, not driving the reticle R. Further, the reticle holder RH and the projection optical system PL can be also placed separately.

A pair of alignment marks (not shown) is arranged on a part of the reticle R. In the present embodiment, the controller (not shown) measures the pair of alignment marks and fiducial marks corresponding to those on the wafer stage WST by using a reticle alignment system before an exposure, e.g., finely drives the reticle holder RH by using results of the measurement, and performs positioning of the reticle R (reticle alignment).

As the projection optical system PL, for example, a dioptric system composed of a plurality of lenses (lens elements) arranged along the optical axis AX parallel to the Z-axis direction is used. The projection optical system PL is, e.g., both-side telecentric and has a predetermined projection magnification (e.g., ¼ or ⅕). Hence, when an illumination area is illuminated by the illumination light IL from the illumination unit IOP, a reduced image of a circuit pattern in the illumination area of the reticle is placed on a second plane (image plane) side via the projection optical system PL by the illumination light IL that passes through the reticle R placed such that its pattern surface is matched almost to a first plane (object plane) of the projection optical system, and the image is formed on an area (exposure area), which is conjugate to the illumination area, on the wafer W on which a resist (a photosensitive agent) is coated.

In the vicinity of the projection optical system PL, an alignment system ALG which detects alignment marks on the wafer W or fiducial marks on the wafer stage WST is arranged. As the alignment system ALG, e.g., a sensor of the image processing type can be used; the sensor of the image processing type is disclosed, e.g., in Kokai (Japanese Unexamined Patent Application Publication) No. 04-065603, its corresponding U.S. Pat. No. 5,493,403 specification, etc. Detection results of the alignment system ALG are sent to the controller (not shown).

The stage unit 50 is equipped with the wafer stage WST that holds the wafer W with a wafer holder (not shown), a wafer stage drive system 124 that drives the wafer stage WST, etc. The wafer stage WST is placed below the projection optical system PL in FIG. 1, and supported, e.g., by a gas hydrostatic bearing, which is an air bearing arranged on the bottom surface of the stage, above the upper surface of a base (not shown) without contact. The wafer stage WST is driven in the X-axis direction and the Y-axis direction in the XY plane (moving plane) by the wafer stage drive system 124 including, e.g., a linear motor, a voice coil motor, etc. at a predetermined stroke, and finely driven in the Z-axis direction orthogonal to the XY plane and the rotation directions (the θx-direction, the θy-direction, and the θz-direction).

As described above, although the wafer stage WST is a single stage which is drivable in 6 degrees of freedom in the present embodiment, not limited to this, the wafer stage WST can be of course constituted by an XY stage movable freely within the XY plane and a table that is driven at least in 3 degrees of freedom directions of the Z, θx, and θy directions on the XY stage.

Positional information of the wafer stage WST is constantly detected by the linear encoder system 20 shown in FIG. 1 and sent to the controller (not shown).

Figure 2:
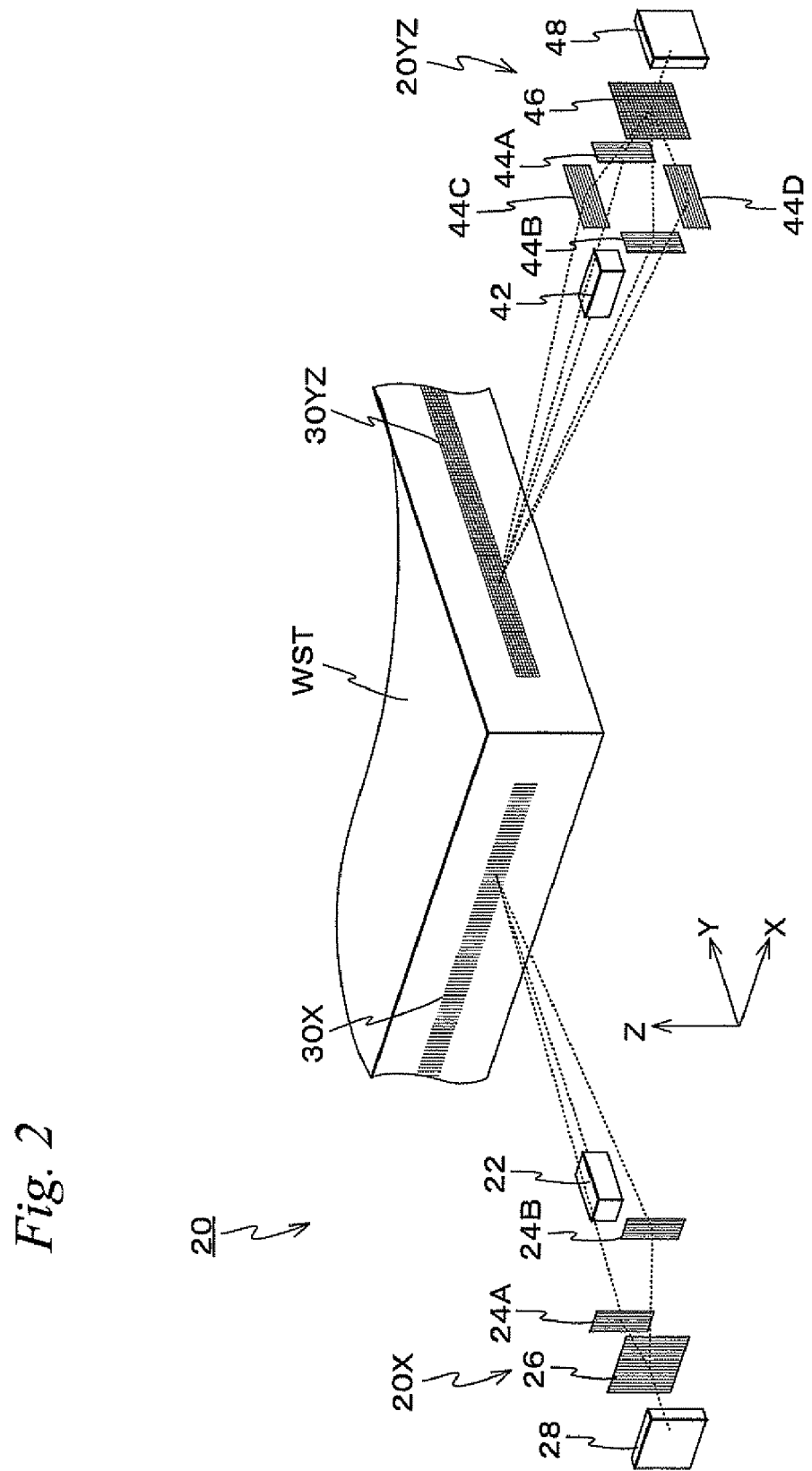
FIG. 2 is a perspective view showing a wafer stage and an encoder.

Describing this further in details, the linear encoder system 20 includes an X-encoder 20X, which are composed of a so-called three-grating interference encoder as shown in FIG. 2, and a YZ-encoder 20YZ.

Figure 3:
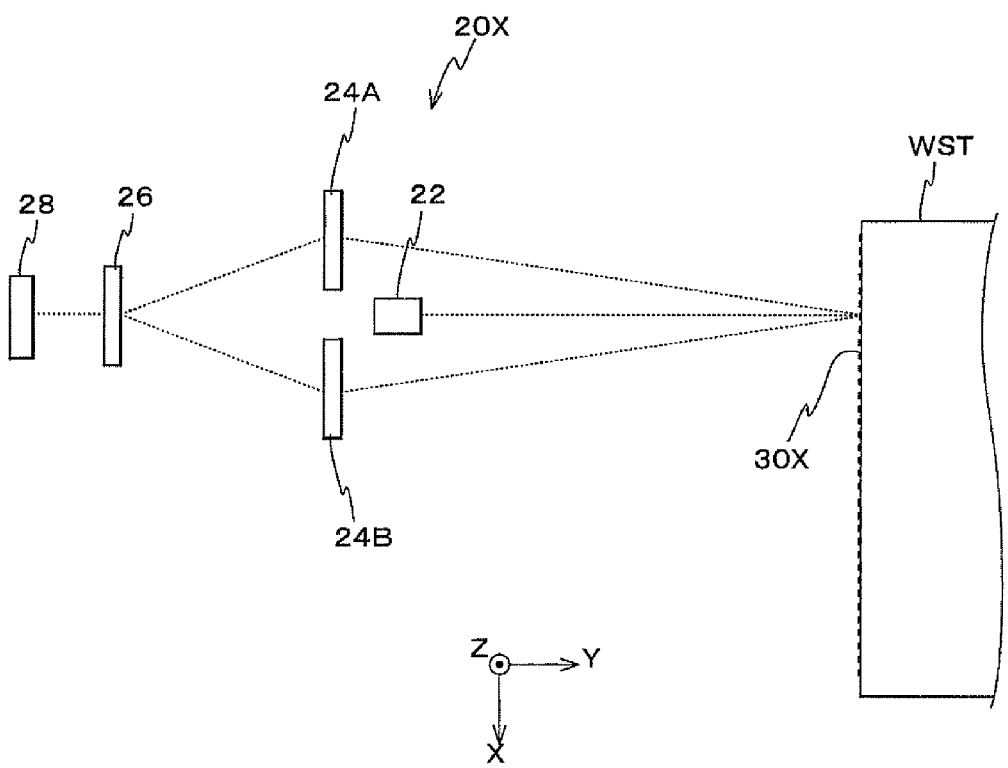
FIG. 3 is a top view of the encoder 20X in FIG. 2.

The X-encoder 20X, as shown in FIGS. 2 and 3, where FIG. 3 shows a top view of the encoder 20X, includes a light source 22 that irradiates a light onto a moving grating 30X which is arranged on a surface of the −Y side of the wafer stage WST, fixed scales 24A, 24B that have a fixed positional relation with the light source 22 and focus diffracted lights generated from the moving grating 30X, an index scale 26 that allows diffracted lights focused at the fixed scales 24A, 24B to interfere with each other, and a detection instrument 28 that detects a light interfered at the index scale 26.

The light source 22 emits a coherent light, e.g., a laser light with a wavelength λ(=850 nm) from the −Y direction toward the +Y direction in FIG. 1. In this case, the position of the light source 22 is set such that the optical axis of the laser light emitted from the light source 22 passes a projection center (matches the optical axis AX in the present embodiment) of the projection optical system PL.

The moving grating 30X is a diffraction grating with a periodic direction in the X-axis direction. This moving grating 30X generates a plurality of diffracted lights with different orders based on incident lights. FIG. 2 shows the ±1st-order diffracted lights of the diffracted lights generated from the moving grating 30X.

The fixed scales 24A, 24B are transmissive phase gratings composed of plates on which a diffraction grating with a periodic direction in the X-axis direction is formed and placed on the −Y side of the light source 22. Further, the index scale 26 is a transmissive phase grating composed of a plate on which a diffraction grating with a periodic direction in the X-axis direction is formed and placed on the −Y side of the fixed scales 24A, 24B.

The fixed scale 24A diffracts the −1st-order diffracted light generated from the moving grating 30X to generate a +1st-order diffracted light and this +1st-order diffracted light travels to the index scale 26. Further, the fixed scale 24B diffracts the +1st-order diffracted light generated from the moving grating 30X to generate a −1st-order diffracted light and this −1st-order diffracted light travels to the index scale 26.

Here, the ±1st-order diffracted lights generated from the fixed scales 24A, 24B overlap to each other at the same position on the index scale 26. In other words, the ±1st-order diffracted lights interfere with each other on the index scale 26.

In the present embodiment, the diffraction angle of each diffracted light generated from the moving grating 30X is determined consequently from wavelength of laser lights emitted from the light source 22 and pitch of the moving grating 30X. Further, the diffraction angle of the ±1st-order diffracted lights generated from the fixed scales 24A, 24B (i.e., an apparent deflection angle of the ±1st-order diffracted lights generated from the moving grating 30X) is determined consequently from wavelength of the laser lights and pitch of the fixed scales 24A, 24B. Hence, it is necessary to set appropriately wavelength of laser light, pitch of the moving grating 30X, and pitch of the fixed scales 24A, 24B. For example, in a case of using the ±1st-order diffracted lights generated from the moving grating 30X for measurement as described above, the light-dark period of fringes on the index scale 26 is twice the arrangement period of the moving grating 30X, and in a case where the index scale 26 with a pitch slightly different from a light-dark period of the fringes, a light quantity distribution in a form of a sine wave can be generated on the detection instrument 28.

Since this light quantity distribution varies as the moving grating 30X moves in the X-axis direction, positional information with respect to the X-axis direction of the wafer stage WST can be measured by detecting the variation with the detection instrument 28.

Instead of the method described above, by rotating the index scale 26 by a trace amount around the Y-axis to generate moire fringes and by using the moire fringes, position measurement of the wafer stage WST can be also performed.

In the present embodiment, the diffraction angle can be made smaller by taking the pitch of the moving grating 30X coarser. The moving grating 30X can be thereby placed at a position relatively far from the light source 22 and the fixed scales 24A, 24B. Further, the ±1st-order diffracted lights generated from the moving grating 30X can be led to the fixed scales 24A, 24B in close proximity to each other.

Further, by appropriately setting thickness of the optical flux of laser lights emitted from the light source 22 and/or areas of the fixed scales 24A, 24B and the index scale 26, a high-precision measurement can be performed even if the distance to the moving grating 30X varies. In other words, the employment of the interference-type encoder in the present embodiment enables to increase a variation permissible amount of distance from the encoder 20X to the moving grating 30X (generally called "standoff").

The YZ-encoder 20YZ, as shown in FIG. 2, includes a light source 42 that irradiates lights onto a moving grating 30YZ arranged on a +X side of the wafer stage WST, fixed scales 44A, 44B and 44C, 44D which have a fixed positional relation with the light source 42 and focus diffracted lights generated from the moving grating 30YZ, an index scale 46 that allows diffracted lights focused by each of the fixed scales 44A, 44B and the fixed scales 44C, 44D to interfere with each other, and a detection instrument 48 that detects lights interfered at the index scale 46. The moving grating 30YZ is a two-dimensional grating in which a diffraction grating with a periodic direction in the Y-axis direction and a diffraction grating with a periodic direction in the Z-axis direction are combined. Further, the position (and the attitude) of the light source 42 is set such that the optical axis of the laser light emitted from the light source 42 passes the projection center of the projection optical system PL (coincided to the optical axis AX in the present embodiment).

The fixed scales 44A, 44B are transmissive phase gratings, similar to the fixed scales 24A, 24B mentioned above, composed of plates on which a diffraction grating with a periodic direction in the Y-axis is formed. On the other hand, fixed scales 44C, 44D are transmissive phase gratings composed of plates on which a diffraction grating with a periodic direction in the Z-axis is formed. The index scale 46 is a transmissive two-dimensional grating on which a diffraction grating with a periodic direction in the Y-axis direction and a diffraction grating with a periodic direction in the Z-axis direction are formed. Further, the detection instrument 48 includes, e.g., a four-divided detection instrument or a CCD.

The fixed scale 44A diffracts the −1st-order diffracted light generated from the diffraction grating with a periodic direction in the Y-axis direction of the moving grating 30YZ to generate a +1st-order diffracted light and this +1st-order diffracted light travels to the index scale 46. Further, the fixed scale 44B diffracts the +1st-order diffracted light generated from the diffraction grating with a periodic direction in the Y-axis direction of the moving grating 30YZ to generate a −1st-order diffracted light and this −1st-order diffracted light travels to the index scale 46.

Here, the ±1st-order diffracted lights generated from the fixed scales 44A, 44B overlap to each other at a same position on the index scale 46. In other words, the ±1st-order diffracted lights interfere with each other on the index scale 46.

On the other hand, the fixed scale 44C the diffracts −1st-order diffracted light generated from the diffraction grating with a periodic direction in the Z-axis direction of the moving grating 30YZ to generate a +1st-order diffracted light and this +1st-order diffracted light travels to the index scale 46. Further, the fixed scale 44D diffracts the +1st-order diffracted light generated from the diffraction grating with a periodic direction in the Z-axis direction of the moving grating 30YZ to generate a −1st-order diffracted light and this −1st-order diffracted light travels to the index scale 46.

Here, the ±1st-order diffracted lights generated from the fixed scales 44C, 44D overlap to each other at a same position on the index scale 46. In other words, the ±1st-order diffracted lights interfere with each other on the index scale 46.

In this case as well, similarly to the X-encoder 20X mentioned above, the diffraction angle of diffracted lights generated from each grating of the moving grating 30YZ is determined consequently from wavelength of laser lights emitted from the light source 42 and pitch of the moving grating 30YZ and the apparent deflecting angle of the ±1st-order diffracted lights generated from the moving grating 30YZ is determined by appropriately determining the wavelength of the laser light and the pitch of the fixed scales 44A to 44D.

Here, in the YZ-encoder 20YZ, a two-dimensional pattern (a checkered pattern) appears on the detection instrument 48. Since this two-dimensional pattern varies dependently on positions of the wafer stage WST in the Y-axis direction and the Z-axis direction, positions of the wafer stage WST in the Y-axis direction and the Z-axis direction can be measured by measuring this variation with a four-divided element, a CCD, etc. that constitutes at least a part of the detection instrument 48.

In the YZ-encoder 20YZ as well, by rotating the index scale 46 by a trace amount around the X-axis to generate moire fringes and by using the moire fringes, position of the wafer stage WST can be measured.

In the exposure apparatus of the present embodiment constituted as described above, similarly to normal steppers, a reticle alignment, a base-line measurement of the wafer alignment system ALG, and a wafer alignment such as an enhanced global alignment (EGA) disclosed, e.g., in Kokai (Japanese Unexamined Patent Application Publication) No. 61-044429 (corresponding U.S. Pat. No. 4,780,617 specification) etc. are performed under instruction of the controller (not shown). After that, a so-called step-and-repeat exposure in which positioning and exposing of a shot area on the wafer onto a pattern projection area (exposure area) of the projection optical system PL are repeated based on results of the wafer alignment is performed and a pattern of the reticle R is sequentially transferred onto a plurality of shot areas on the wafer W. While these operations are performed, the controller (not shown) drives the wafer stage WST via the wafer stage drive system 124 based on measurement results of the encoders 20X, 20YZ mentioned above.

As described above, according to the present embodiment, the moving grating 30X (30YZ) is arranged on a side of the wafer stage WST, a light is irradiated from the light source 22 (42) to the moving grating 30X (30YZ), diffracted lights generated from the moving grating 30X (30YZ) are allowed to interfere with each other by the fixed scales 24A, 24B (44A to 44D), which have a fixed positional relation with the light source 22 (42), and the index scale 26 (46), and the interfered lights are detected by the detection instrument 28 (48). In this case, similarly to conventional interferometers, since a measurement with the side of the wafer stage WST can be performed because of the arrangement of the moving grating 30X (30YZ) on the side of the wafer stage WST, the optical axis of lights irradiated from the light source 22 can be set to pass on the optical axis of the projection optical system PL, and a position measurement of the wafer stage WST can thereby be performed without Abbe errors. Further, for the encoder in the present embodiment, since interference occurs between lights passing through extremely close optical paths such as the ±1st-order diffracted lights, influence by a temperature fluctuation (a fluctuation of a refractive index) of ambient atmosphere, influence by a short-term fluctuation of measured values, which is caused, e.g., by the temperature fluctuation of atmosphere on the beam optical paths, can be reduced in comparison with an interferometer, which uses interference of lights passing through entirely different optical paths which diverge toward a movable mirror and a fixed mirror. Further, in the present embodiment, since it is unnecessary to arrange additionally a moving grating around the wafer stage WST, upsizing of the entire wafer stage WST can be suppressed, and hence, a high-precision positioning and a higher acceleration of the wafer stage WST can be achieved. Therefore, a high-precision position measurement of the wafer stage WST, a high-precision positioning and a higher acceleration of the wafer stage WST, and a high-throughput and high-precision exposure can be realized eventually.

In the embodiment described above, although the position of the wafer stage WST in the X-axis direction, the Y-axis direction, and the Z-axis direction was measured by using the encoder, not limited to this, only at least one axis direction can be measured by using the encoder. In this case, other directions can be measured by using another measuring device such as a laser interferometer. For example, the position of the wafer stage WST in the Z-axis direction can be measured by using a multiple-point focus position detection system that detects Z-positions of the wafer surface.

Further, since the wafer stage WST is movable in 6 degrees of freedom directions in the embodiment described above, measurement in 6 degrees of freedom directions can be performed by arranging a plurality of the encoders 20X, 20YZ. Further, for the encoder 20X, a constitution similar to the encoder 20YZ can be employed to perform a measurement in two-axis directions.

Second Embodiment

Figure 4A:
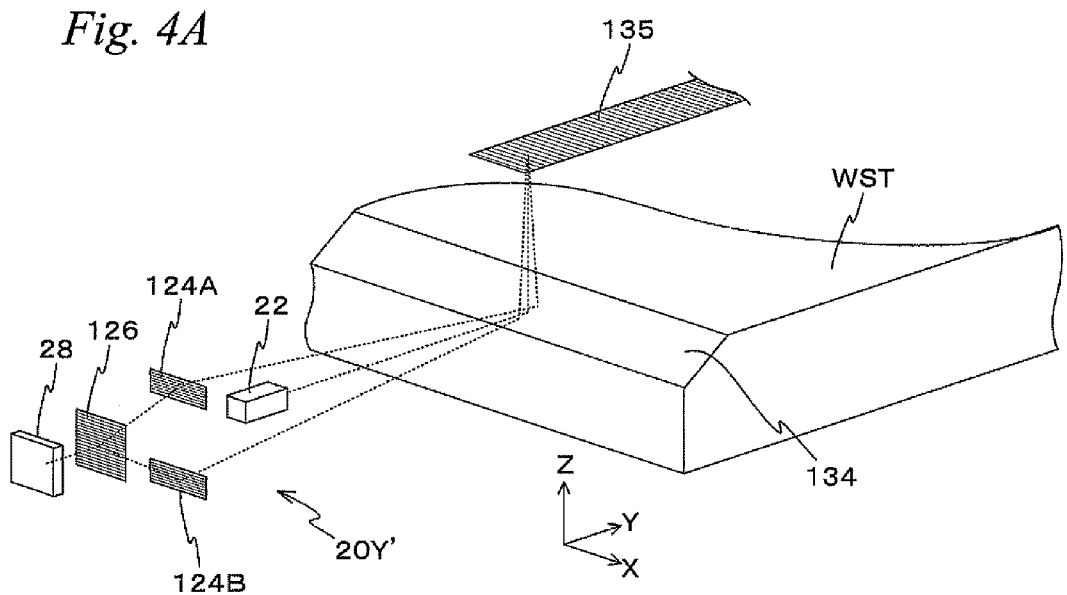
FIG. 4A is a perspective view for explaining an encoder in the second embodiment.
Figure 4B:
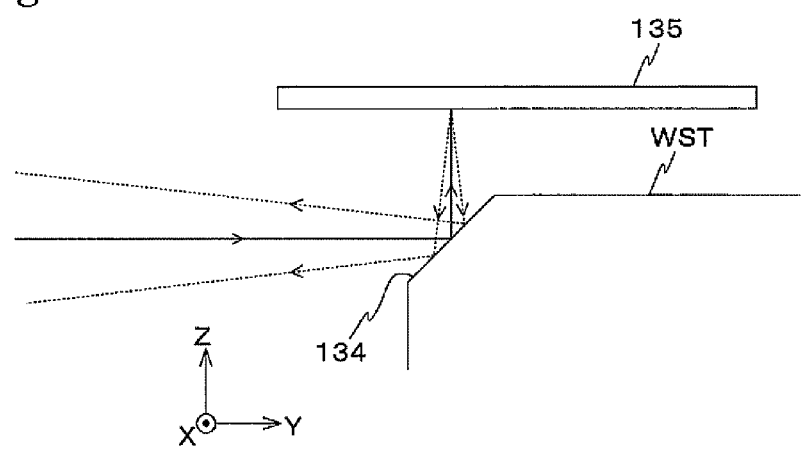
FIG. 4B is a view showing a condition in which the vicinity of a reflection plane 134 in FIG. 4A is seen from the +X direction.

Next, we describe a second embodiment of the present invention with FIGS. 4A and 4B. Here, for constituent parts identical to or equivalent to those in the first embodiment described above, the same marks are used and their explanations are simplified or omitted.

FIG. 4A shows a perspective view corresponding to FIG. 2 in the first embodiment. As shown in FIG. 4A, in the present embodiment, a reflection plane 134 is arranged on the –Y side end of the wafer stage WST and the constitution of a main body of an encoder 20Y' is different from that of the encoder 20X in the first embodiment. The reflection plane 134 is formed by vapor-depositing, e.g., aluminum etc. on a plane tilted by 45 degrees to the XY plane formed at the –Y end of the wafer stage WST. In other words, the reflection plane 134 crosses the XY plane on the YZ plane at an acute angle. Further, above the wafer stage WST, a first fixed scale 135 in a plate shape with the Y-axis direction as its longitudinal direction is arranged substantially parallel to the XY plane. The first fixed scale 135 is a reflective scale on which a pattern (e.g., a diffraction grating) with a periodic direction in the Y-axis direction is formed, and is fixed, e.g., on a lower surface of a supporting surface plate (not shown) that supports the projection optical system PL. Since the first fixed scale 135 has a diffraction grating on its lower surface (its –Z surface), it is also referred to as a fixed grating, a grating member, etc. Further, in the present embodiment, the position in the X-axis direction of laser lights which enter the reflection plane 134 along the Y-axis direction, is set such that the optical axis of the lights passes the projection center of the projection optical system PL and the center of the first fixed scale 135 is set substantially at the same position with respect to the X-axis direction of the optical axis of the laser lights that enters the reflection plane 134. Further, the supporting surface plate on which the projection optical system PL is mounted is supported by three poles to which anti-vibration mechanisms are severally arranged. For example, as disclosed in International Publication No. 2006/038952 pamphlet, the supporting surface plate can be supported by suspending it from a main frame member (not shown) etc. placed above the projection optical system PL. Further, the first fixed scale 135 can be also arranged to another frame member, e.g., a measurement frame supported by suspending from the main frame member, instead of the supporting surface plate. In this case, the supporting surface plate (i.e., the projection optical system PL) may not be supported by suspending from the main frame member.

Although the main body of the encoder 20Y' is constituted substantially similarly to the encoder 20X in the first embodiment described above as a whole, it is different on a point that second fixed scales 124A, 124B are placed at positions far from the light source 22 in the -Y direction and the +Z direction or the -Z direction, on a point that patterns (e.g., transmissive phase gratings) of the second fixed scales 124A, 124B are periodic in the Z-axis direction, and on a point that a pattern of an index scale 126 (e.g., a transmissive phase grating) is periodic in the Z-axis direction.

In the main body of the encoder 20Y', a light from the light source 22 is irradiated to the reflection plane 134 along the Y-axis direction, as shown in FIG. 4B, reflected toward the +Z direction on the reflection plane 134, and enters the first fixed scale 135. This fixed scale 135 generates a plurality of diffracted lights with different orders due to incidence of lights. In FIGS. 4A and 4B, the ±1st-order diffracted lights generated from the first fixed scale 135 out of the diffracted lights are illustrated.

These ±1st-order diffracted lights enter the reflection plane 134, and, as shown in FIG. 4B, are reflected on the reflection plane 134 (at a reflection angle identical to the incident angle), and then, similarly to the first embodiment, enter to the detection instrument 28 via the second fixed scales 124A, 124B and the index scale 126.

In this case, since an incident position of the light from the light source 22 to the first fixed scale 135 varies as the wafer stage WST moves in the Y-axis direction, a light quantity distribution detected by the detection instrument 28 varies. Therefore, positional information on the wafer stage WST in the Y-axis direction can be measured by detecting the variation of the light quantity distribution with the detection instrument 28. In the present embodiment, the encoder is constituted by including at least the main body of the encoder 20Y' and the first fixed scale 135.

Meanwhile, although FIG. 4A illustrated only the main body of the encoder 20Y' performing position measurement of the wafer stage WST in the Y-axis direction, not limited to this, position measurement of the wafer stage WST in the X-axis direction can be performed by arranging a reflection plane similar to the reflection plane 134 on the +X side end (or the -X side end) of the wafer stage WST and a first fixed scale used for the X-axis direction measurement, and accordingly by arranging a main body of an encoder used for the X-axis direction measurement similar to the main body of the encoder 20Y'. In this case, a reflection plane arranged on the X side end of the wafer stage WST crosses the XY plane at an acute angle (e.g., 45 degrees) within the ZX plane, the first fixed scale used for the X-axis direction measurement has a pattern with a periodicity in the X-axis direction, and arranged substantially parallel to the XY plane with the X-axis direction as its longitudinal direction. Further, the optical axes of laser lights which severally enter the two reflection planes can be placed to be orthogonal to each other at the projection center of the projection optical system PL. Further, instead of employing an encoder as a measuring device used for position measurement in the X-axis direction, another measuring device, e.g., such as an interferometer etc. can be employed. Further, position measurement in the X-axis direction can be performed by using the main body of the encoder in the present embodiment and position measurement in the Y-axis direction can be performed by using a measuring device, being not the encoder.

As it has been described above, according to the second embodiment, since the position measurement of the wafer stage WST is performed by using the first fixed scale 135, which is separately arranged from the wafer stage WST, via the reflection plane 134 arranged on the wafer stage WST, it is unnecessary to arrange a scale on the wafer stage WST, and upsizing of the wafer stage WST can be suppressed. Further, since it is possible to lead the ±1st-order diffracted lights generated from the first fixed scale 135 to the second fixed scales 124A, 124B in close proximity to each other, a high-precision position measurement can be realized.

In the embodiment described above, although only one main body of the encoder 20Y', which measures position of the wafer stage WST in the Y-axis direction with the reflection plane 134 of the wafer stage WST, was arranged, not limited to this, two main bodies of encoders that measure a position in the Y-axis direction can be arranged separately with a predetermined distance in the X-axis direction. In this case, by passing the optical axes of lights irradiated from the two main bodies of the encoders through positions away at an equal distance from the optical axis of the projection optical system PL with respect to the X-axis direction to average measurement results of each main body of encoders, and the position of the wafer stage WST in the Y-axis direction can be measured without Abbe errors, and furthermore, by taking a difference between measurement results of each main body of encoders, the rotation around the Z-axis of the wafer stage WST can be measured. Further, a reflection plane can be arranged on the +Y side end of the wafer stage WST, and main bodies of encoders used for the Y-axis direction measurement can be placed on both sides of the projection optical system PL with respect to the Y-axis direction. Similarly, main bodies of encoders used for the X-axis direction measurement can be placed on both sides of the projection optical system PL. Moreover, as the first fixed scale 135, a scale of a transmissive type can be employed instead of that of a reflective type.

Third Embodiment

Figure 5A:
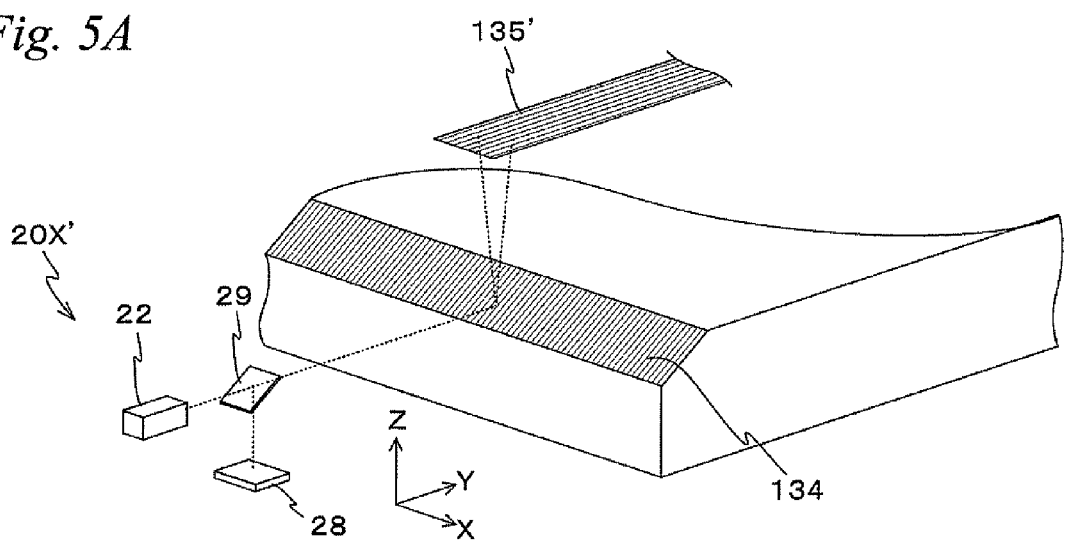
FIG. 5A is a perspective view for explaining an encoder of the third embodiment.
Figure 5B:
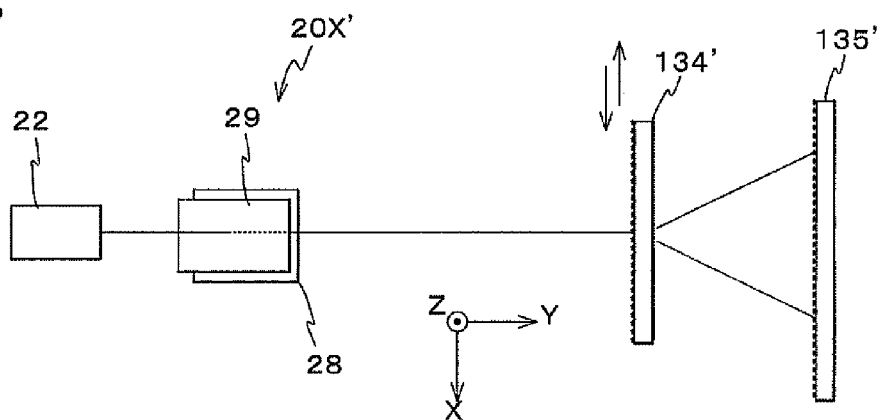
FIG. 5B is a view for explaining the principle of the encoder in FIG. 5A, and FIGS. 5C and 5D are views showing modified examples of the fixed scale in FIG. 5A.

Next, we describe a third embodiment of the present invention with FIGS. 5A and 5B. Here, for constituent parts identical to or equivalent to those in the second embodiment described above, the same marks are used and their explanations are simplified or omitted.

As shown in FIG. 5A, in the present embodiment, a pattern with a periodic direction in the X-axis direction (e.g., a diffraction grating) is formed on the reflection plane 134 of the wafer stage WST, a fixed scale 135' on which a pattern with a periodic direction in the X-axis direction (e.g., diffraction grating) is formed and which has the Y-axis direction as its longitudinal direction is arranged substantially parallel to the XY plane above the wafer stage WST, and furthermore, the constitution of the main body of the encoder 20X' is different from the first and second embodiments described above.

The fixed scale 135' is a reflective scale, and fixed on the lower surface of the supporting surface plate (not shown) that supports the projection optical system PL, similarly to the second embodiment. On the other hand, the main body of the encoder 20X' includes a light source 22, a beam splitter 29 arranged on the +Y side of the light source 22, and the detection instrument 28 arranged below (the −Z side of) the beam splitter 29.

FIG. 5B shows a principle diagram of the encoder in the present embodiment. Here, although for the encoder shown in FIG. 5A a constitution in which a pattern is formed on the reflection plane 134 is employed, in FIG. 5B for convenience of explanation, the reflection plane 134 in FIG. 5A is replaced by a transmissive scale 134' which is practically equivalent to the reflection plane 134.

Figure 5C:
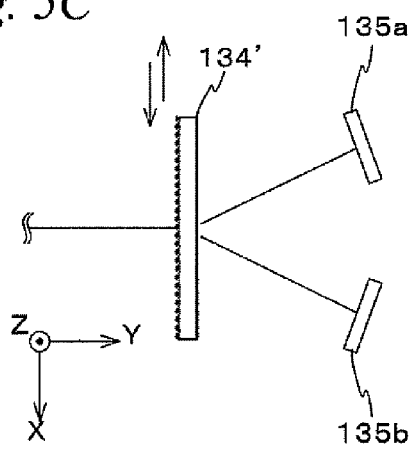
Figure 5D:
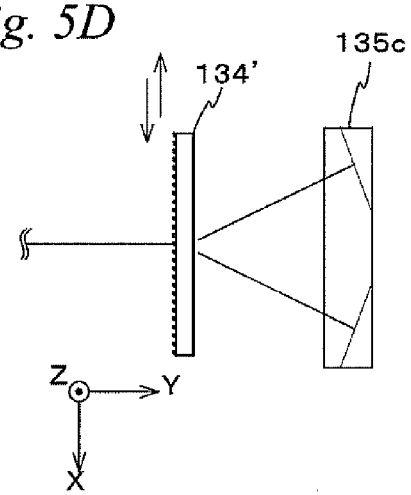

As shown in FIG. 5B, in the main body of the encoder 20X' in the present embodiment, laser lights emitted from the light source 22 transmit the beam splitter 29, and enter the transmissive scale 134' (the reflection plane 134). Then, diffracted lights with a plurality of orders are generated on a pattern (a diffraction grating) formed on the scale 134' (the reflection plane 134). Note that in FIGS. 5A and 5B, only the ±1st-order diffracted lights of them are shown. Then, the fixed scale 135' further diffracts the −1st-order diffracted light generated on the pattern formed on the scale 134' (the reflection plane 134) to generate a +1st-order diffracted light, and furthermore, diffracts the +1st-order diffracted light generated on the pattern formed on the scale 134' (the reflection plane 134) to generate a −1st-order diffracted light. The ±1st-order diffracted lights generated from the fixed scale 135' travel to the scale 134' (the reflection plane 134) again, and overlap and interfere with each other at an identical position on the scale 134' (the reflection plane 134). Instead of the fixed scale 135' with the diffraction grating, fixed optical elements such as reflective mirrors 135a, 135b as shown in FIG. 5C and a prism 135c as shown in FIG. 5D can be used. In a use of the reflective mirrors 135a, 135b or the prism 135c as a fixed optical element, similarly to the fixed scale 135', the reflective mirrors or the prism is extended in the Y-axis direction.

Then, interfered lights interfered on the scale 134' (the reflection plane 134) are deflected by the beam splitter 29 toward the detection instrument 28 and received by the detection instrument 28.

The detection instrument 28 is capable of measuring positional information of the wafer stage WST in the X-axis direction by detecting light quantity distributions of interfered lights. It is obvious from the foregoing explanations that the encoder is constituted by including at least the fixed scale 135' and the main body of the encoder 20X' in the present embodiment.

In the present embodiment as well, by rotating the pattern of the fixed scale 135' and the pattern on the reflection plane 134 by a fine angle to generate moire fringes and by detecting light quantity distributions caused by the moire fringes, the positional information of the wafer stage WST in the X-axis direction can be measured.

In comparison to the encoders in the first and second embodiments, even if the wafer stage WST is remote from the light source 22 and the detection instrument 28, the encoder in the present embodiment is constituted to be harder to suffer from influence of an air fluctuation etc. in the space. This is because the interference described above occurs between the reflection plane 135 and the fixed scale 135' and the optical path connecting the light source 22 and the detection instrument 28 to the reflection plane 134 does not in principle influence the interference.

As described above, according to the present embodiment, since the position measurement of the wafer stage WST is performed by using the pattern on the reflection plane 134 arranged on the wafer stage WST and the fixed scale 135' arranged separately from the wafer stage WST, it is unnecessary to arrange a scale externally to the wafer stage WST and it becomes possible to suppress upsizing of the wafer stage WST. Further, in the present embodiment as well, since the encoder is hard to suffer from influence of an air fluctuation etc. In comparison to conventional interferometers, the position measurement of the wafer stage WST can be performed. Therefore, an exposure with a high throughput and a high precision can be realized also in the present embodiment.

Figure 6A:
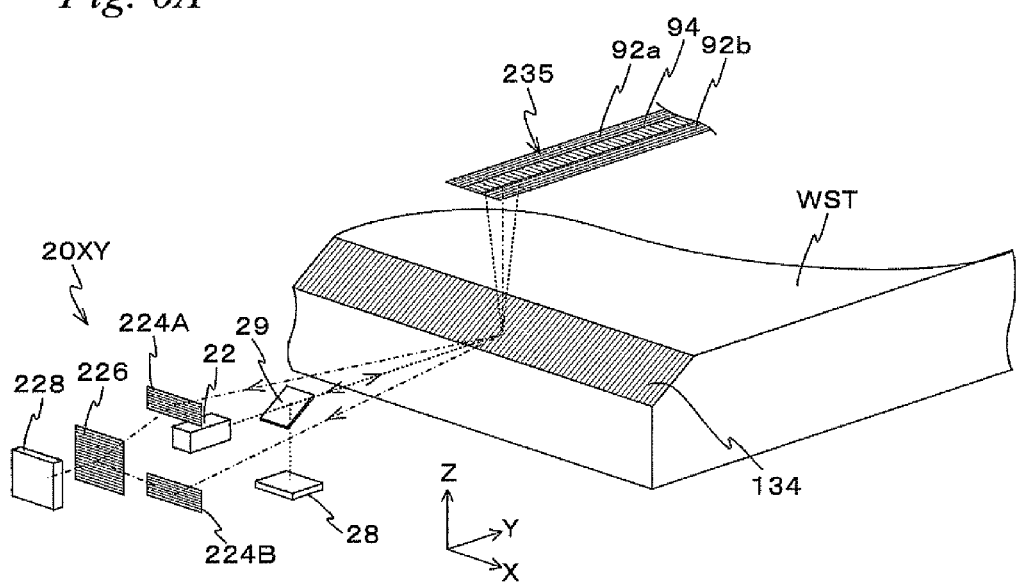
FIG. 6A is a perspective view showing a modified example (1) in the third embodiment.

In the third embodiment described above, although only positional information in the X-axis direction was measured, not limited to this, it is also possible to employ a constitution as shown in FIG. 6A. In other words, in the present example, as shown in FIG. 6A, the first fixed scale 235 is arranged instead of the fixed scale 135 and the main body of the encoder 20XY is employed. On the first fixed scale 235, patterns 92a, 92b with a periodic direction in the X-axis direction (hereinafter, referred to as "X pattern") and a pattern 94 with a periodic direction in the Y-axis direction (hereinafter, referred to as "Y pattern") sandwiched between the X patterns 92a, 92b are arranged.

In this case, the Y pattern 94 is placed at a position where the 0th-order light (the 0th-order diffracted light, in this case, the regular reflection light) of a plurality of diffracted lights generated from the pattern on the reflection plane 134 enters, and the X patterns 92a, 92b are placed at positions where the +1st-order diffracted light and the −1st-order diffracted light enter severally.

On the other hand, the main body of the encoder 20XY has a constitution such that the main body of the encoder 20X' in FIG. 5A and the main body of the encoder 20Y' in the second embodiment (see FIG. 4A) are combined and, specifically, is equipped with the light source 22, the beam splitter 29, the detection instrument 28, second fixed scales 224A, 224B, an index scale 226, and a detection instrument 228.

The main body of the encoder 20XY constituted in this manner can measure position with respect to the X-axis direction similarly to the measurement performed by the main body of the encoder (the main body of the encoder in FIG. 5A) 20X' in the third embodiment described above. Further, since the 0th-order light generated from the reflection plane 134 is used regarding position in the Y-axis direction (in FIG. 6A, a light used for the measurement in the Y-axis direction is shown in dash-dotted lines), the measurement can be performed similarly to the main body of the encoder (the main body of the encoder in FIG. 4A) 20Y' in the second embodiment described above.

By using the encoder shown in FIG. 6A, since the position of the wafer stage WST in the X-axis direction and in the Y-axis direction can be measured and it is unnecessary to arrange a moving scale externally to the wafer stage WST similarly to the third embodiment described above, upsizing of the entire wafer stage WST can be suppressed. Further, in comparison to interferometers, the encoder is hard to suffer from influence such as an air fluctuation and a high-precision position measurement is made possible.

Figure 6B:
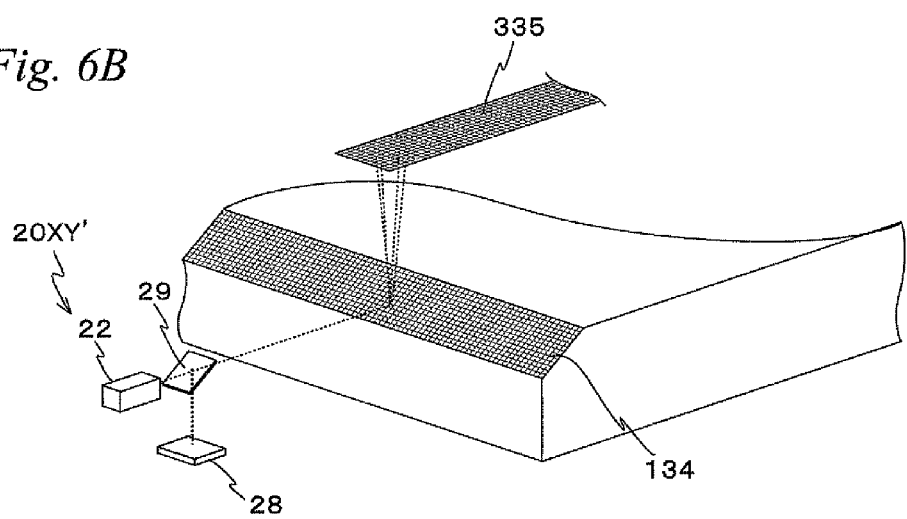
FIG. 6B is a perspective view showing a modified example (2) in the third embodiment.

Furthermore, in the third embodiment described above, it is also possible to employ a constitution as shown in FIG. 6B (an encoder including at least a fixed scale 335 and a main body of an encoder 20XY').

In FIG. 6B, unlike FIG. 6A, a pattern with a form of a two-dimensional grating is arranged on the reflection plane 134 and the fixed scale 335 is arranged instead of the fixed scale 235. A two-dimensional pattern with a form of a grating is arranged for the fixed scale 335, and a position in the XY two-dimensional direction can be measured by using these two-dimensional patterns. In this case, by using, e.g., a four-divided element, a CCD, etc. as the detection instrument 28, similarly to the detection instrument 48 in the first embodiment (see FIG. 2), a two-dimensional pattern that appears on the detection instrument 28 is detected. By detecting variation of the two-dimensional pattern, the position of the wafer stage WST within the XY plane can be measured.

In FIG. 5A, the position measurement of the wafer stage WST in the X-axis direction was performed by using the reflection plane 134 with a pattern with a periodic direction in the X-axis direction on the −Y side end of the wafer stage WST, the fixed scale 135', and the main body of the encoder 20X'. Not limited to this, a reflection plane similar to the reflection plane 134 with a pattern with a periodic direction in the Y-axis direction is arranged on the +X side end (or the −X side end) of the wafer stage WST and a fixed scale used for the Y-axis direction measurement is arranged, corresponding to these, a main body of an encoder, similar to the main body of the encoder 20X', used for the Y-axis direction measurement is arranged, and thus, the position measurement of the wafer stage WST in the Y-axis direction can be performed.

Similarly, in the example in FIG. 6A, a reflection plane similar to the reflection plane 134 with a pattern with a periodic direction in the Y-axis direction is arranged on the +X side end (or the −X side end) of the wafer stage WST, a fixed scale similar to the fixed scale 235 is placed with the X-axis direction as its longitudinal direction, and a main body of an encoder similar to the main body of the encoder 20XY can be placed by facing to the reflection plane on the +X side end (or the −X side end) of the wafer stage WST. Similarly, in the example in FIG. 6B, a reflection plane similar to the reflection plane 134 on which a pattern with a form of a two-dimensional grating is formed, is arranged on the +X side end (or the −X side end) of the wafer stage WST, a fixed scale similar to the fixed scale 335 is placed with the X-axis direction as its longitudinal direction, and the main body of the encoder 20XY' can be placed by facing to the reflection plane on the +X side end (or the −X side end) of the wafer stage WST.

Additionally, arbitrary two of the three encoders with constitutions, respectively, shown in FIGS. 5A, 6A, and 6B are combined, and one of the two encoders combined can be placed on the X side of the wafer stage WST and the other can be placed on the Y side of the stage.

Fourth Embodiment

Next, we describe a fourth embodiment of the present invention with FIGS. 7A to 8C.

In the present embodiment, the positional information of the wafer stage WST in the Z-axis direction is also measured by using the main body of the encoder 20XY described above shown in FIG. 6A and the first fixed scale 135 of the second embodiment described above. Since a pattern with a periodic direction in the Y-axis direction similar to the pattern 94 formed on the first fixed scale 235 mentioned above is formed on the first fixed scale 135 (hereinafter, for convenience, denoted as the pattern 94), it can be considered that the main body of the encoder 20XY and the first fixed scale 235 (a part of the pattern 94) are used.

In the present embodiment, two laser lights L1, L2 are irradiated from the light source 22 onto the reflection plane 134 at different angles (see FIG. 7B), and positional information in the Z-axis direction and the Y-axis direction are measured by using measurement results obtained with these two laser lights L1, L2.

FIGS. 7A to 7C simplistically show a vicinity of the first fixed scale 135 and the −Y end of the wafer stage WST (the reflection plane 134). These drawings show that the Z position of the wafer stage WST varies from the −Z side to the +Z side in an order of FIGS. 7A, 7B, and 7C. Note that FIGS. 7A and 7C show the state in FIG. 7B with dotted lines.

As shown in FIG. 7B out of the drawings, when the two laser lights L1 and L2 with different angles from the light source are irradiated onto the reflection plane 134, the laser lights L1, L2 reflect on the reflection plane 134, respectively, at reflection angles identical to the incident angles, and enter the pattern 94 of the first fixed scale 135. At this point, positions at which each laser light entered to the pattern 94 of the first fixed scale 135 are shown as the point A and the point B. Although not shown, the incident laser lights are diffracted into the Y-axis direction, respectively, on the point A and the point B, pass optical paths similar to the dash-dotted lines in FIG. 6A, and enter severally detection instruments prepared individually (for convenience, denoted as detection instruments 228A, 228B). Note that the second fixed scales 224A, 224B and the index scale 226 can be used in common for the laser lights L1, L2.

Here, the detection instruments 228A, 228B can obtain measurement results corresponding to positions of the point A and the point B. In this case, as clear from a comparison among FIGS. 7A to 7C, a space between the points A' and B' is wider when a space between the points A and B in FIG. 7B is compared with that between the points A' and B' in FIG. 7A and a space between the points A'' and B'' is narrower when the space between the points A and B in FIG. 7B is compared with that between points A'' and B'' in FIG. 7C. Therefore, since the distance between each point relates to position of the wafer stage WST in the Z-axis direction, a position Pz of the wafer stage WST in the Z-axis direction can be expressed by the following equation (1) with k as a coefficient (the coefficient k is determined by the angle etc. of the laser lights L1, L2) supposed that a measurement result obtained with the laser light L1 is denoted with Ma and a measurement result obtained with the laser light L2 is denoted with Mb.

$$Pz = k(Ma - Mb) \quad (1)$$

In the present embodiment, the position of the wafer stage WST in the Z-axis direction is calculated with the above equation (1) and the positional control of the wafer stage WST is performed.

Figure 8A:
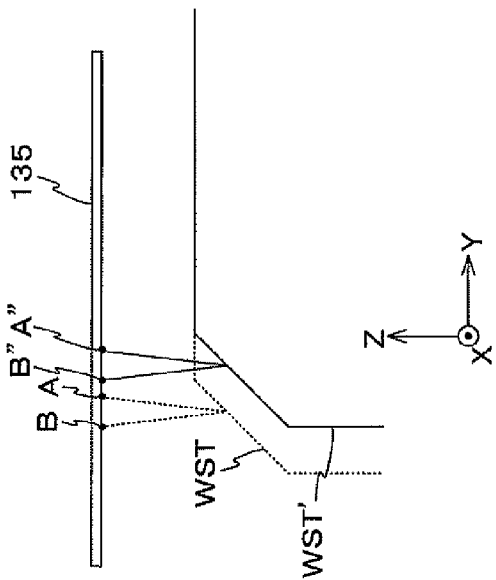
FIGS. 8A to 8C are views for explaining the principle of position measurement with respect to the Y-axis direction for the wafer stage in the fourth embodiment.
Figure 8B:
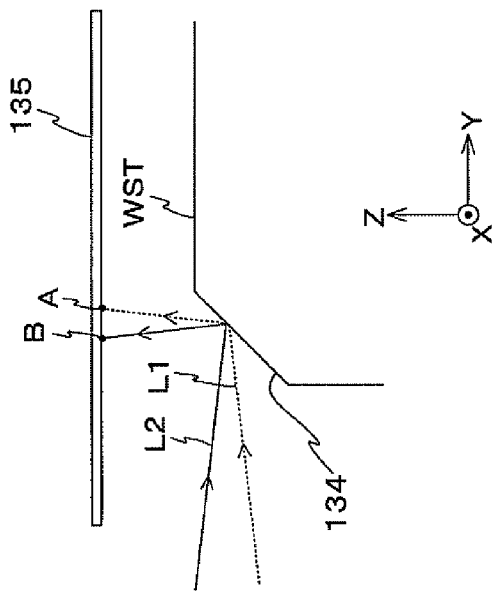
Figure 8C:
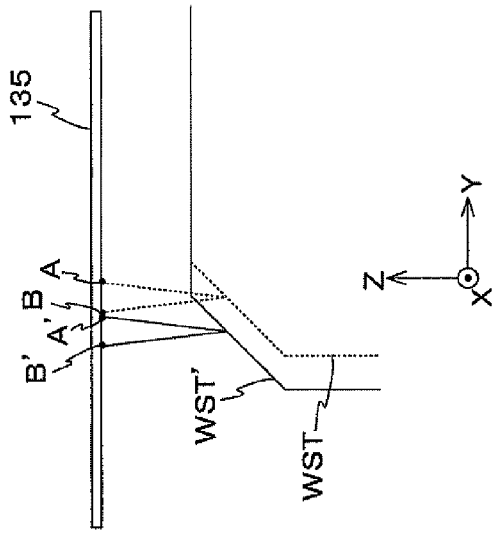

On the other hand, FIGS. 8A to 8C show conditions in which the positions of the wafer stage WST in the Y-axis direction are different with each other. FIG. 8B shows a condition identical to that shown in FIG. 7B mentioned above, FIG. 8A shows a condition in which the stage shifts to the −Y side from the Y position in FIG. 8B as a standard (a condition in FIG. 5B is shown with dotted lines), and FIG. 8C shows a condition in which the stage shifts to the +Y side from the Y position in FIG. 5B as a standard (a condition in FIG. 5B is shown with dotted lines).

Here, the detection instruments 228A, 228B can obtain measurement results corresponding to positions of the points A and B (the points A' and A'' or B' and B''). In this case, as clear from comparison among FIGS. 8A to 8C, the points A' and B' in FIG. 8A shift from the points A and B to the −Y side by a distance identical to the movement distance of the wafer stage WST, and the points A'' and B'' in FIG. 8C shift from the points A and B to the +Y side by a distance identical to the movement distance of the wafer stage WST. Therefore, supposing that the measurement result obtained with the laser light L1 is denoted with Ma and the measurement result obtained with the laser light L2 is denoted with Mb, a position Py of the wafer stage WST with respect to the Y-axis direction can be expressed as the following equation (2).

$$Py = (Ma + Mb)/2 \quad (2)$$

In the present embodiment, the position of the wafer stage WST in the Y-axis direction is calculated with the above equation (2) and the positional control of the wafer stage WST is performed.

As described above, according to the present embodiment, by employing an encoder with a constitution similar to the encoder in FIG. 6A, by measuring with the two laser lights L1, L2, and by using measurement results obtained and the equations (1) and (2) described above, positions in the Y-axis and the Z-axis directions can be measured. It is thereby possible to perform a measurement without increases of the number of fixed scales arranged around the wafer stage WST. Instead of using two lights, reflection planes are prepared at different angles and positional information in the Y-axis and the Z-axis directions can be similarly measured.

In the fourth embodiment described above, although the position of the wafer stage WST with respect to the Y-axis direction and the Z-axis direction was measured by using a constitution similar to that of the encoder in FIG. 6A, not limited to this, position measurement with respect to the Y-axis direction and the Z-axis direction can be performed with a method similar to that in the fourth embodiment described above in a constitution of other embodiments (e.g., a constitution in FIG. 4A or 6B).

Meanwhile, two encoders with the two laser lights L1, L2 at different angles described in the fourth embodiment described above are placed, respectively, on one side and the other side of the projection optical system with respect to the Y-axis direction, and tilt information of the wafer stage WST (rotation information in the θx direction) can be measured from positional information of the wafer stage WST in the Z-axis direction measured with the two encoders. Similarly, the two encoders with the two laser lights L1, L2 at different angles described in the fourth embodiment described above are placed, respectively, on one side and the other side of the projection optical system with respect to the X-axis direction, and tilt information of the wafer stage WST (rotation information in the θy direction) can be measured from positional information of the wafer stage WST in the Z-axis direction measured with the two encoders. Alternatively, two encoders with the two laser lights L1, L2 at different angles described in the fourth embodiment described above can be placed at least on one direction of the +X side, the –X side, the +Y side, and the –Y side of the projection optical system. Of course, in each of the cases described above, reflection planes can be severally prepared at different angles instead of using the two encoders with the laser lights L1, L2 at different angles.

Figure 9A:
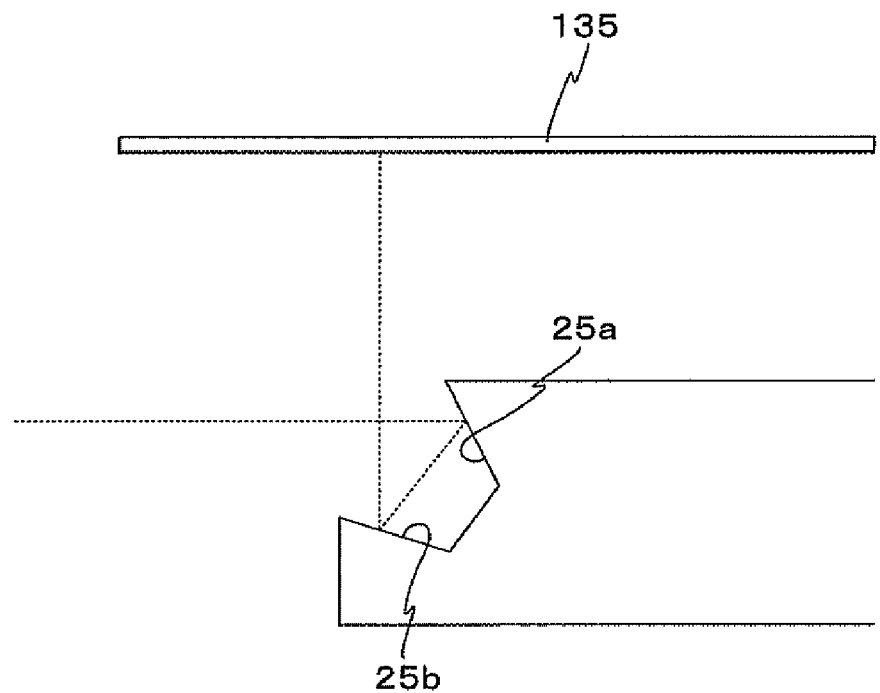
FIGS. 9A and 9B are views showing modified examples of the reflection plane 134.

In the second to fourth embodiments and the modified example described above, although descriptions were given for arranging the reflection plane inclined by 45 degrees to the XY plane on an end of the wafer stage WST, not limited to this, it is also possible to employ a constitution as shown in FIG. 9. In other words, by arranging two reflection planes 25a, 25b on the wafer stage WST as shown in FIG. 9A, it is also possible to allow the stage to function equivalently to the reflection plane inclined by 45 degrees. By doing this, a pattern with a periodic direction in the X-axis direction and a pattern with a periodic direction in the Y-axis direction can be separately arranged on each reflection plane. This increases degrees of freedom in production and design of patterns.

Figure 9B:
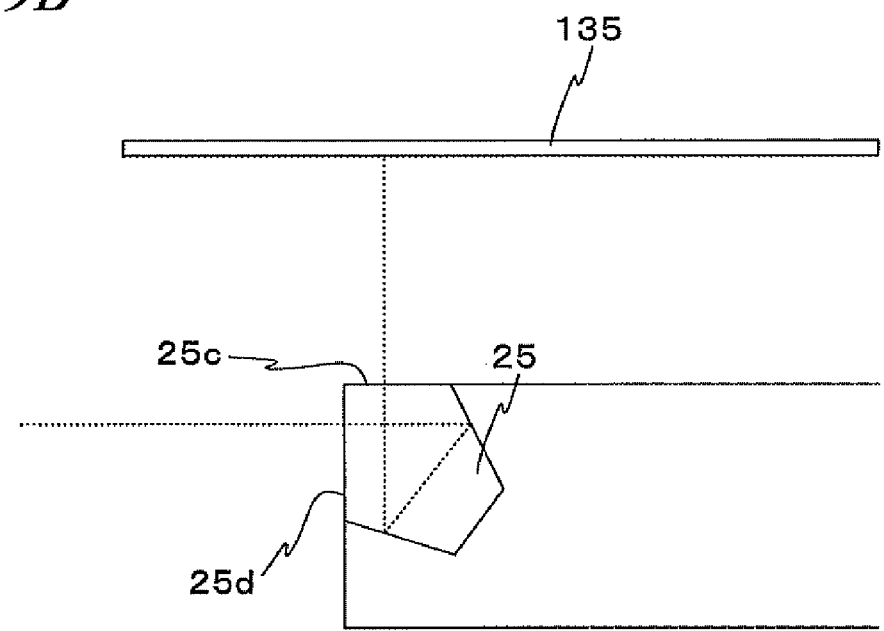

Note that a prism 25 can be arranged on the wafer stage WST as shown in FIG. 9B instead of the reflection planes 25a, 25b. In this case, a pattern can be arranged not only on the reflection planes, but also at least one of transmission planes 25c, 25d. Employing such a prism 25 brings an advantage that parallel movement of the wafer stage WST can be purely measured by utilizing insensibility to rotation between the input/output lights and the prism.

Figure 10:
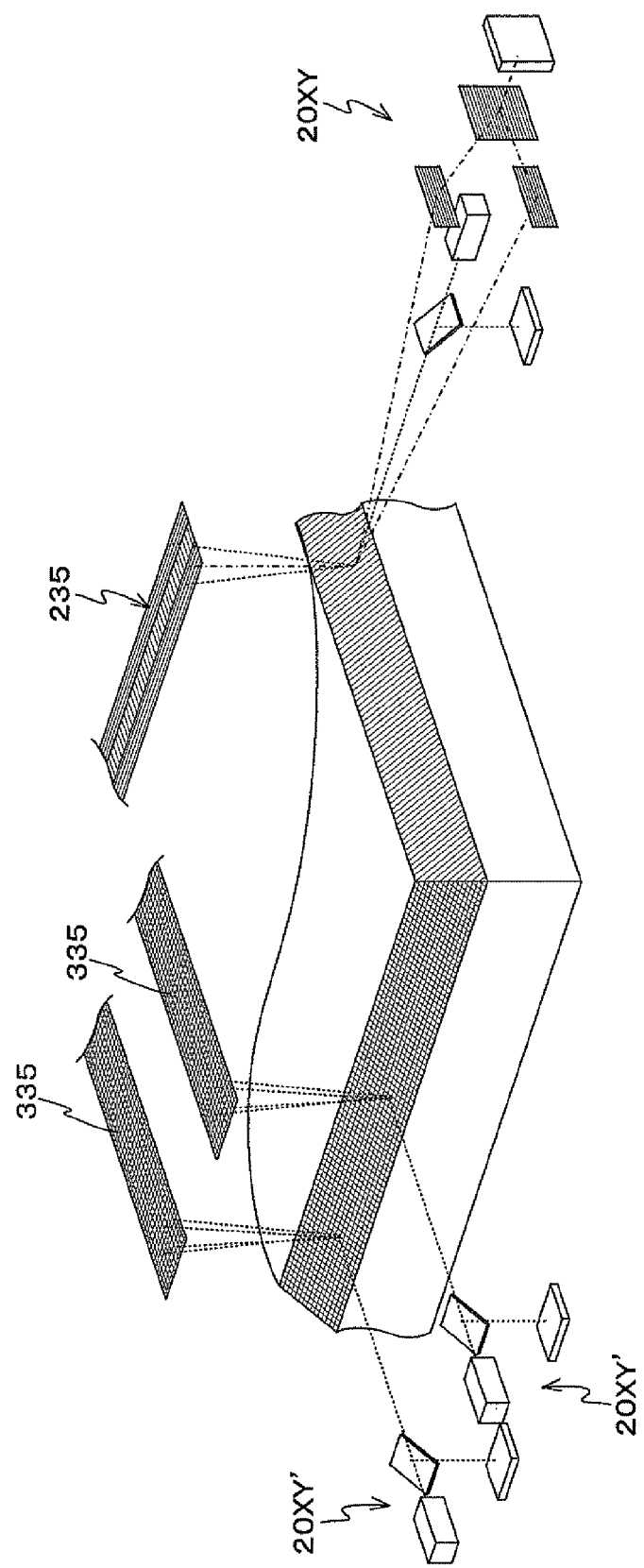
FIG. 10 is a view showing an example of placement of the encoder for performing the 6 degrees of freedom measurement.

Note that it is possible to use encoders, in an appropriate combination, which relate to each of the embodiments and the modified example described above. Therefore, as shown in FIG. 10 for example, a simultaneous measurement in the X, Y, Z, θx, θy, and θz directions is possible by using two main bodies of the encoder 20XY' in FIG. 6B and the encoder which is capable of measuring with respect to two axis directions described in the fourth embodiment (see FIGS. 7A to 8C). In this case, by passing the optical axes of lights irradiated from the two main bodies of the encoder 20XY' into positions with an equal distance from the optical axis of the projection optical system PL, a high-precision measurement without Abbe errors is made possible.

In each of the embodiments described above, although the measurement was performed by using the ±1st-order diffracted lights, not limited to this, the measurement can be performed by using the ±2nd-order, the 3rd-order, the n-th-order diffracted lights.

Further, in each of the embodiments and the modified example described above, although the light sources 22, 42 were placed by facing to sides of the wafer stage WST, for example, the light sources can be placed far from the wafer stage WST, and laser lights emitted from the light sources can be transmitted by using an optical member (such as an optical fiber and/or a mirror, etc.). Moreover, in arranging a plurality of main bodies of encoders, a laser light from one light source can be led to each of main bodies of encoders by splitting into a plurality of lights.

In each of the embodiments and the modified example described above, at least a part of the main body of the encoder (e.g., except for the light source) mentioned above can be arranged, e.g., on the supporting surface plate on which the projection optical system PL is mounted, the measurement frame mentioned above etc. Further, in each of the embodiments and the modified example described above, a one-dimensional and/or two-dimensional periodic pattern (a diffraction grating etc.) can be directly formed on the reflection plane of the wafer stage WST, or, e.g., a periodic pattern is formed on a plate-type member made of a material with a low coefficient of thermal expansion (ceramics etc.) and the plate-shaped member can be fixed on the wafer stage.

In each of the embodiments described above, although descriptions were given for using the encoders for the measurement of the wafer stage WST, not limited to this, it is also possible to use the encoders for the measurement of the reticle holder RH.

In each of the embodiments described above, as disclosed, e.g., in International Publication No. 1999/46835 pamphlet (corresponding U.S. Pat. No. 7,023,610 specification), harmonics obtained by amplifying laser lights with a single wavelength in an infrared region or a visible region, which is oscillated from a DFB semiconductor laser or a fiber laser, with a fiber amplifier into which, e.g., erbium (or both of erbium and ytterbium) is doped and by wavelength-conversing to an ultraviolet light with a nonlinear optical crystal can be used as the illumination light IL.

Further, the projection optical system may not be only a reduction system but also either of an equal-magnifying and a magnifying system. The projection optical system may not be only a dioptric system but also either of a reflection system and a catadioptric system, and its projected image may be either of an inverted image and an erected image. Moreover, although an exposure area onto which the illumination light IL is irradiated via the projection optical system PL is an on-axis area including the optical axis AX within the field of the projection optical system PL, as disclosed, e.g., in International Publication No. 2004/107011 pamphlet, the exposure area may be an off-axis area that does not include the optical axis AX, similarly to a catadioptric system of a so-called inline type in which an optical system (a reflection system or a catadioptric system) that has a plurality of reflection planes and forms an intermediate image at least once is arranged in a part of the system and which has a single optical axis. In this case, the center of the exposure area, i.e., the projection center of the projection optical system PL is different from the optical axis AX.

In each of the embodiments described above, although descriptions were given for a case where the present invention was applied to an exposure apparatus of the step-and-repeat type (a so-called stepper), not limited to this, it is also possible to apply the present invention to a scanning exposure apparatus of the step-and-scan type. In this case, to measure position of a reticle stage, being movable at least in a single axis direction while holding the reticle, it is also possible to use the encoder of each of the embodiments described above. In a case where the encoder is equipped with the fixed scales 135, 135', 235, 335 shown in FIG. 5A etc., the fixed scales can be placed either above or below the reticle stage. Furthermore, the present invention can be suitably applied to an exposure apparatus of the step-and-stitch type, an exposure apparatus of the proximity type, a mirror projection aligner, etc.

In addition, the present invention can be also applied to an immersion-type exposure apparatus in which liquid is filled between a projection optical system and a wafer as disclosed, e.g., in International Publication No. 2004/053955 pamphlet etc. In this immersion-type exposure apparatus, the reflection plane (134 etc.) of the wafer stage can be covered with a liquid repellency cover member (e.g., a glass plate, thin film, etc.), a member (e.g., a groove) can be arranged on the upper surface of the wafer stage to avoid that the liquid reaches a reflection plane. Further, it is possible to apply the present invention not only to an exposure apparatus with an exposure illumination light in a far ultraviolet region, a vacuum ultraviolet region, etc., but also to an exposure apparatus, e.g., with an EUV light, an X-ray, and a charged particle beam such as an electron beam and an ion beam.

Note that the exposure apparatus in each of the embodiments described above may be also a twin-wafer-stage type capable of performing an exposure operation and a measurement operation (e.g., mark detection with an alignment system) substantially parallel with the two wafer stages, as disclosed, e.g., in Kokai (Japanese Unexamined Patent Application Publication) No. 10-163099, Kokai (Japanese Unexamined Patent Application Publication) No. 10-214783 (corresponding U.S. Pat. No. 6,590,634 specification), International Publication No. 98/40791 pamphlet, etc. Moreover, the exposure apparatus of the embodiment described above may be also an apparatus equipped with a measurement stage including a measurement member (e.g., fiducial marks, and/or sensors, etc.) in addition to the wafer stage, e.g., as disclosed in International Publication No. 2005/074014 pamphlet etc.

In each of the embodiments described above, an optically transmissive mask, where a predetermined light shielding pattern (or phase pattern, light attenuation pattern) was formed on a optically transmissive substrate, was used. Instead of the mask, an electronic mask that forms a transmissive pattern, a reflective pattern, or a light emission pattern (or a variable molding mask including, e.g., a DMD (Digital Micro-mirror Device) that is a type of a non-emissive image display element (also called a spatial light modulator)) may be used based on the electronic data of a pattern to be exposed, as disclosed, e.g., in U.S. Pat. No. 6,778,257 specification. Further, as disclosed, e.g., in International Publication No. 2001/035168 pamphlet, the present invention can be also applied to an exposure apparatus (a lithography system) that forms a device pattern on a wafer by forming fringes on the wafer.

Moreover, as disclosed, e.g., in Published Japanese Translation of PCT application No. 2004-519850 (corresponding U.S. Pat. No. 6,611,316 specification), the present invention can be also applied to an exposure apparatus that composes two reticle patterns on a wafer via a projection optical system and substantially simultaneously performs a double exposure onto one shot area on the wafer through one-time scan exposure.

Further, an apparatus that forms a pattern on an object is not limited to the exposure apparatus (lithography system) mentioned above, but the present invention can be also applied, e.g., to an apparatus that forms a pattern on an object, e.g., in an inkjet method.

Further, the present invention is not limited to an application to the exposure apparatus for manufacturing semiconductor devices, but can be widely applied, e.g., to exposure apparatus used to manufacture various devices, e.g., display devices such as a liquid-crystal display element that is formed on a square glass plate, a plasma display, etc., an imaging device (CCD etc.), a micro machine, an organic EL, a thin film magnetic head, a DNA chip, etc. Moreover, the present invention can be also applied to an exposure apparatus that manufactures a mask (photomask, reticle, etc.) on which mask patterns of various devices are formed by using a lithography process. As described above, an object irradiated with energy beams to be exposed in each of the embodiments described above is not limited to a wafer but may be another object such as a glass plate, a ceramic substrate, a film member, a mask blanks, etc.

Further, the exposure apparatus (the pattern forming apparatus) in each of the embodiments described above is manufactured by assembling various sub-systems including each constituent element exemplified in the scope of claims so as to maintain a predetermined mechanical precision, an electrical precision, and an optical precision. To secure these various types of precision, adjustment for achieving an optical precision of various optical systems, adjustment for achieving a mechanical precision of various mechanical systems, and adjustment for achieving an electrical precision of various electronic systems are performed before and after the assembly. An assembly process from various sub-systems to the exposure apparatus includes mechanical connection among various sub-systems, wiring connection of electrical circuits, piping connection of pneumatic circuits, etc. Note that of course the assembly process of each sub-system comes before the assembly process from various sub-systems to the exposure apparatus. Once the assembly process of various sub-systems to the exposure apparatus ends, the total adjustment is performed, and various types of precision as the entire exposure apparatus are secured. It is desirable that the manufacturing of the exposure apparatus is performed in a clean room of which temperature, cleanness, etc. are controlled.

As long as the national laws in designated (or elected) states to which this international application is applied permit, the disclosures cited in all of the Japanese Unexamined Patent Application Publications, International Publication pamphlet, and the U.S. Patent Specifications with respect to the exposure apparatuses cited in each of the embodiments and the modified examples described above are fully incorporated herein by reference.

A semiconductor device is manufactured by conducting: a step in which function/performance design of a device is performed; a step in which a reticle is manufactured based on the design step; a step in which a wafer is formed from a silicon material; a step in which a reticle pattern is transferred on the wafer by the exposure apparatus of each embodiment described above; a step in which the wafer on which the pattern was transferred (formed) is developed; a step in which a circuit pattern is formed by applying etching to the wafer after development and exposed members of areas other than areas with residual resist are removed; a step in which unnecessary resist after completing etching is removed; a device assembly step (including a dicing process, a bonding process, and a packaging process); an inspection step, etc.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable-body apparatus, comprising:
a movable body that moves at least in an axis direction within a two-dimensional plane including a first axis and a second axis orthogonal to each other; and
a measuring device that has a light source which irradiates a light onto a first grating arranged on a predetermined plane of the movable body, the predetermined plane crossing the two-dimensional plane, an optical system which allows a plurality of diffracted lights generated from the first grating to interfere with each other, and a detector which detects the interfered light, and that measures positional information of the movable body with respect to at least the axis direction, wherein
the optical system has a second grating composed of a transmissive grating, and an optical member that changes directions of the plurality of diffracted lights generated at the first grating toward the second grating, and
the detector detects the interfered light of the plurality of diffracted lights emitted from the second grating.

2. The movable-body apparatus according to claim 1, wherein the first grating is a one-dimensional grating with a periodic direction in a direction within the predetermined plane.

3. The movable-body apparatus according to claim 1, wherein the first grating is a two-dimensional grating with periodic directions in two directions crossing each other within the predetermined plane.

4. The movable-body apparatus according to claim 3, wherein the predetermined plane is a plane substantially perpendicular to the two-dimensional plane.

5. The movable-body apparatus according to claim 1, the apparatus further comprising:
a controller that controls a position of the movable body by using measurement results of the measuring device.

6. An exposure apparatus that exposes an object to form a pattern, the apparatus comprising:
the movable-body apparatus according to claim 1 which includes a movable body that moves while holding the object.

7. An exposure apparatus that transfers a pattern formed on a mask onto an object, the apparatus comprising:
the movable-body apparatus according to claim 1 which includes a movable body that moves while holding at least one of the mask and the object.

8. A movable-body apparatus, comprising:
a movable body that moves at least in an axis direction within a two-dimensional plane including a first axis and a second axis orthogonal to each other, and has a reflection plane which crosses the two-dimensional plane on a part thereof; and
a measuring device that has a light source which irradiates a light onto the reflection plane, a fixed scale which has a one-dimensional grating with a periodic direction in the axis direction, and which a light reflected on the reflection plane enters, an optical system which allows a plurality of diffracted lights generated from the one-dimensional grating to interfere with each other, and a detector that detects the interfered light, and that measures positional information of the movable body with respect to at least the axis direction, wherein
the optical system has a transmissive grating which the plurality of diffracted lights enter, and
the detector detects the interfered light of the plurality of diffracted lights emitted from the transmissive grating.

9. The movable-body apparatus according to claim 8, wherein
the one-dimensional grating reflects the light to generate a plurality of diffracted lights, and
the reflection plane makes the diffracted lights enter the optical system.

10. The movable-body apparatus according to claim 8, the apparatus further comprising:
a controller that controls a position of the movable body by using measurement results of the measuring device.

11. An exposure apparatus that exposes an object to form a pattern, the apparatus comprising:
the movable-body apparatus according to claim 8 which includes a movable body that moves while holding the object.

12. An exposure apparatus that transfers a pattern formed on a mask onto an object, the apparatus comprising:
the movable-body apparatus according to claim 8 which includes a movable body that moves while holding at least one of the mask and the object.

13. A movable-body apparatus, comprising:
a movable body that moves at least in an axis direction within a two-dimensional plane including a first axis and a second axis orthogonal to each other; and
a measuring device that measures positional information of the movable body with respect to at least the axis direction, by irradiating a light onto a first grating arranged along a plane of the movable body, the plane crossing the two-dimensional plane, and by detecting a diffracted lights via the first grating, wherein
the measuring device has a second grating composed of a transmissive grating, an optical member that changes directions of the diffracted lights toward the second grating, and a detector that detects an interfered light of the diffracted lights emitted from the second grating.

14. The movable-body apparatus according to claim 13, the apparatus further comprising:
a controller that controls a position of the movable body by using measurement results of the measuring device.

15. An exposure apparatus that exposes an object to form a pattern, the apparatus comprising:
the movable-body apparatus according to claim 13 which includes a movable body that moves while holding the object.

16. An exposure apparatus that transfers a pattern formed on a mask onto an object, the apparatus comprising:
the movable-body apparatus according to claim 13 which includes a movable body that moves while holding at least one of the mask and the object.

17. A movable-body apparatus, comprising:
a movable body that moves in a direction parallel to at least a single axis within a two-dimensional plane including a first axis and a second axis orthogonal to each other; and
a measuring device having: a light source that irradiates a light onto a moving grating on a predetermined plane of the movable body, the predetermined plane crossing the two-dimensional plane; a fixed grating of which a positional relation with the light source is fixed, which is placed parallel to the two-dimensional plane, and which returns a light diffracted at the moving grating to the moving grating; and a detector that detects a light interfered after passing through the moving grating again.

18. The movable-body apparatus according to claim 17, wherein
the fixed grating includes a one-dimensional grating with a periodic direction in a direction parallel to the single axis, and
the light source irradiates a light which is parallel to the single axis to the moving grating.

19. The movable-body apparatus according to claim 17, wherein
the fixed grating includes a one-dimensional grating with a periodic direction in a direction parallel to the single axis,
the light source irradiates a plurality of lights inclined to the single axis by different angles to the moving grating within a plane perpendicular to the two-dimensional plane including the single axis, and
the measuring device computes a position in a direction perpendicular to the two-dimensional plane of the movable body by using a detection result which is obtained by the detector with each interfered light generated from the plurality of lights.

20. The movable-body apparatus according to claim 17, wherein the measuring device measures positional information of the movable body with respect to a direction parallel to the single axis within the two-dimensional plane by using a 0th-order light generated at the moving grating, and measures positional information of the movable body with respect to a direction orthogonal to the single axis within the two-dimensional plane by using a diffracted light except for the 0th-order light.

21. The movable-body apparatus according to claim 20, wherein the fixed grating includes a first one-dimensional grating which is placed at a position which a 0th-order light generated at the moving grating enters and has a periodic direction in a direction parallel to the single axis, and a second one-dimensional grating, which is placed at a position which a diffracted light except for the 0th-order light enters and has a periodic direction in a direction orthogonal to the single axis.

22. The movable-body apparatus according to claim 17, the apparatus further comprising:
a controller that controls a position of the movable body by using measurement results of the measuring device.

23. An exposure apparatus that exposes an object to form a pattern, the apparatus comprising:
the movable-body apparatus according to claim 17 which includes a movable body that moves while holding the object.

24. An exposure apparatus that transfers a pattern formed on a mask onto an object, the apparatus comprising:
the movable-body apparatus according to claim 17 which includes a movable body that moves while holding at least one of the mask and the object.

25. A movable-body apparatus, comprising:
a movable body that moves in a first and a second directions orthogonal to each other within a predetermined plane and has a reflection plane which crosses the predetermined plane at an acute angle and on which a diffraction grating is formed; and
a measuring device that includes a fixed grating, which is arranged by extending in the first direction substantially parallel to the predetermined plane and a part of which faces the reflection plane, irradiates a light beam onto the reflection plane along the first direction, and detects diffracted beams which are generated from the reflection plane and reflected on the fixed grating and the reflection plane, after allowing the beams to interfere with each other, and measures positional information of the movable body.

26. The movable-body apparatus according to claim 25, wherein in the movable body, the reflection plane is arranged by extending along the second direction.

27. The movable-body apparatus according to claim 25, wherein the diffraction grating is periodic at least in the second direction.

28. The movable-body apparatus according to claim 25, wherein the fixed grating includes a grating periodic in the first direction and positional information of the movable body in the first direction is measured.

29. The movable-body apparatus according to claim 25, wherein the fixed grating includes a grating periodic in the second direction and positional information of the movable body in the second direction is measured.

30. The movable-body apparatus according to claim 25, the apparatus further comprising:
a controller that controls a position of the movable body by using measurement results of the measuring device.

31. An exposure apparatus that exposes an object to form a pattern, the apparatus comprising:
the movable-body apparatus according to claim 25 which includes a movable body that moves while holding the object.

32. An exposure apparatus that transfers a pattern formed on a mask onto an object, the apparatus comprising:
the movable-body apparatus according to claim 25 which includes a movable body that moves while holding at least one of the mask and the object.

33. A movable-body apparatus, comprising:
a movable body that moves in a first and a second directions orthogonal to each other within a predetermined plane; and
a measuring device that includes a fixed scale which is arranged by extending in the first direction substantially parallel to the predetermined plane and has a diffraction grating, irradiates a light beam onto the fixed scale via a reflection plane of the movable body and detects a plurality of diffracted beams generated from the fixed scale after allowing the beams to interfere with each other via a transmissive grating, and measures positional information of the movable body.

34. The movable-body apparatus according to claim 33, wherein the measuring device detects the plurality of diffracted beams via the reflection plane.

35. The movable-body apparatus according to claim 33, wherein the measuring device irradiates the light beam onto the reflection plane along the first direction and a position of the fixed scale is practically identical with a position of the light beam with respect to the second direction.

36. The movable-body apparatus according to claim 33, wherein the reflection plane includes a first plane that crosses the predetermined plane at an acute angle within a plane parallel to the first direction and orthogonal to the predetermined plane.

37. The movable-body apparatus according to claim 33, wherein on the movable body, the reflection plane is arranged by extending along the second direction.

38. The movable-body apparatus according to claim 33, wherein the diffraction grating is periodic at least in the first direction and positional information of the movable body in the first direction is measured.

39. The movable-body apparatus according to claim 33, wherein the diffraction grating is periodic at least in the second direction and positional information of the movable body in the second direction is measured.

40. The movable-body apparatus according to claim 33, wherein the diffraction grating includes a one-dimensional first grating with a periodic direction in the first direction and a one-dimensional second grating with a periodic direction in the second direction and the positional information of the movable body in the first and the second directions is measured.

41. The movable-body apparatus according to claim 40, wherein
on the fixed scale, the second grating is placed on both sides of the first grating with respect to the second direction, and
the measuring device detects diffracted beams severally generated from the two second gratings after allowing the beams to interfere with each other, and measures positional information of the movable body in the second direction.

42. The movable-body apparatus according to claim 33, wherein the diffraction grating includes a two-dimensional grating periodic in the first and the second directions and positional information of the movable body in the first and the second directions is measured.

43. The movable-body apparatus according to claim 33, wherein the measuring device detects diffracted beams which are generated from the fixed scale in different directions by irradiating the light beam after allowing the beams to interfere with each other.

44. The movable-body apparatus according to claim 33, wherein the measuring device irradiates a plurality of light beams onto the fixed scale by making irradiated positions different in a periodic direction of the diffraction grating.

45. The movable-body apparatus according to claim 44, wherein the measuring device detects diffracted beams generated from the fixed scale by irradiating two light beams paired up out of the plurality of light beams, after allowing the beams to interfere with each other.

46. The movable-body apparatus according to claim 44, wherein on the movable body, a diffraction grating is formed on the reflection plane and the plurality of light beams include beams generated from the diffraction grating of the reflection plane in different directions.

47. The movable-body apparatus according to claim 46, wherein a periodic direction of the diffraction grating on the reflection plane is practically identical with that of the diffraction grating of the fixed scale.

48. The movable-body apparatus according to claim 46, wherein the diffraction grating of the reflection plane is periodic at least in the second direction.

49. The movable-body apparatus according to claim 46, wherein the diffraction grating of the reflection plane includes a two-dimensional grating periodic in the first and the second directions.

50. The movable-body apparatus according to claim 44, wherein the measuring device irradiates the plurality of light beams onto the reflection plane from different directions to make the irradiated positions different on the fixed scale.

51. The movable-body apparatus according to claim 33, wherein
the reflection plane includes a second plane that is arranged by extending along the first direction and crosses the predetermined plane at an acute angle within a plane parallel to the second direction and orthogonal to the predetermined plane, and
the measuring device includes another fixed scale, being different from the fixed scale, which is arranged by extending in the second direction substantially parallel to the predetermined plane and has a diffraction grating, irradiates a light beam onto the another fixed scale via the second plane, and detects a plurality of diffracted beams which are generated from the another fixed scale and reflected on the second plane after allowing the beams to interfere with each other.

52. The movable-body apparatus according to claim 51, wherein the measuring device irradiates a light beam onto the second plane along the second direction, and a position of the another fixed scale is practically identical with that of the light beam with respect to the first direction.

53. The movable-body apparatus according to claim 51, wherein the another fixed scale includes a diffraction grating periodic with respect to at least one of the first and the second directions.

54. The movable-body apparatus according to claim 51, wherein the measuring device irradiates a plurality of light beams onto the another fixed scale by making irradiated positions different in a periodic direction of the diffraction grating.

55. The movable-body apparatus according to claim 54, wherein on the movable body, a diffraction grating is formed on the second plane and the plurality of light beams include beams generated from the diffraction grating of the second plane in different directions.

56. The movable-body apparatus according to claim 54, wherein the measuring device irradiates the plurality of light beams onto the second plane from different directions to make the irradiated positions different on the another fixed scale.

57. The movable-body apparatus according to claim 33, the apparatus further comprising:
a controller that controls a position of the movable body by using measurement results of the measuring device.

58. An exposure apparatus that exposes an object to form a pattern, the apparatus comprising:
the movable-body apparatus according to claim 33 which includes a movable body that moves while holding the object.

59. An exposure apparatus that transfers a pattern formed on a mask onto an object, the apparatus comprising:
the movable-body apparatus according to claim 33 which includes a movable body that moves while holding at least one of the mask and the object.

60. A movable-body apparatus, comprising:
a movable body that moves in a first and a second directions orthogonal to each other within a predetermined plane, and has a first reflection plane that is arranged by extending along the second direction and crosses the predetermined plane at an acute angle within a plane parallel to the first direction and orthogonal to the predetermined plane and a second reflection plane that is arranged by extending along the first direction and crosses the predetermined plane at an acute angle within a plane parallel to the second direction and orthogonal to the predetermined plane; and a measuring device that includes a first and a second reflecting members substantially parallel to the predetermined plane and arranged by extending, respectively, in the first and the second directions, irradiates a first light beam onto the first reflection plane and allows a plurality of first diffracted beams reflected on the first reflecting member and the first reflection plane to interfere with each other via a first transmissive grating and detects the beams, irradiates a second light beam onto the second reflection plane and allows a plurality of second diffracted beams reflected on the second reflecting member and the second reflection plane to interfere with each other via a second transmissive grating and detects the beams, and measures positional information of the movable body in the first and the second directions, wherein a diffraction grating is arranged on at least the first reflecting member out of the first reflection plane and the first reflecting member, and a diffraction grating is arranged on at least the second reflecting member out of the second reflection plane and the second reflecting member.

61. The movable-body apparatus according to claim 60, the apparatus further comprising:
a controller that controls a position of the movable body by using measurement results of the measuring device.

62. An exposure apparatus that exposes an object to form a pattern, the apparatus comprising:
the movable-body apparatus according to claim 60 which includes a movable body that moves while holding the object.

63. An exposure apparatus that transfers a pattern formed on a mask onto an object, the apparatus comprising:
the movable-body apparatus according to claim 60 which includes a movable body that moves while holding at least one of the mask and the object.

64. An exposure method in which an object is exposed and a pattern is formed on the object, the method comprising:
irradiating a light onto a first grating arranged on a predetermined plane, which crosses a two-dimensional plane including a first axis and a second axis orthogonal to each other, of a movable body that moves at least in an axis direction within the two-dimensional plane while holding the object, and measuring positional information of the movable body with respect to at least the axis direction by using an interfered light of a plurality of diffracted lights generated at the first grating, wherein
the plurality of diffracted lights pass through a second grating composed of a transmissive grating to be the interfered light, and the predetermined plane is a plane substantially perpendicular to the two-dimensional plane; and
exposing the object while the movable body is moved, based on the measurement results.

65. A device manufacturing method, comprising:
a lithography process in which an object is exposed and a pattern is formed on the object by using the exposure method according to claim 64; and
a process in which a treatment is applied to the object on which the pattern was formed.

66. An exposure method in which an object is exposed with an exposure light, the method comprising:
holding the object by a movable body that moves in a first and a second directions orthogonal to each other within a predetermined plane and has a reflection plane which crosses the predetermined plane at an acute angle and on which a diffraction grating is formed;
measuring positional information of the movable body, by irradiating a light beam onto the reflection plane along the first direction and by detecting diffracted beams, which are generated from the reflection plane and reflected on a fixed grating arranged by extending in the first direction substantially parallel to the predetermined plane and the reflection plane, after allowing the beams to interfere with each other; and
moving the movable body based on the positional information.

67. A device manufacturing method, comprising:
a lithography process in which an object is exposed and a pattern is formed on the object by using the exposure method according to claim 66; and
a process in which a treatment is applied to the object on which the pattern was formed.

68. An exposure method in which an object is exposed with an exposure light, the method comprising:
holding the object by a movable body that moves in a first and a second directions orthogonal to each other within a predetermined plane;
measuring positional information of the movable body, by irradiating a light beam onto a fixed scale, which is arranged by extending in the first direction substantially parallel to the predetermined plane and has a diffraction grating, via a reflection plane of the movable body, and by detecting a plurality of diffracted beams generated from the fixed scale after allowing the plurality of diffracted beams to interfere with each other via the reflection plane and a transmissive grating; and
moving the movable body based on the positional information.

69. A device manufacturing method, comprising:
a lithography process in which an object is exposed and a pattern is formed on the object by using the exposure method according to claim 68; and
a process in which a treatment is applied to the object on which the pattern was formed.

* * * * *

UNITED STATES PATENT AND TRADEMARK OFFICE
CERTIFICATE OF CORRECTION

| | |
|---|---|
| PATENT NO. | : 8,390,780 B2 |
| APPLICATION NO. | : 12/330119 |
| DATED | : March 5, 2013 |
| INVENTOR(S) | : Makinouchi et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1010 days.

Signed and Sealed this
Eleventh Day of November, 2014

Michelle K. Lee
*Deputy Director of the United States Patent and Trademark Office*